United States Patent
Dasgupta et al.

(10) Patent No.: US 10,727,241 B2
(45) Date of Patent: Jul. 28, 2020

(54) 3D NAND STRUCTURES INCLUDING GROUP III-N MATERIAL CHANNELS

(71) Applicant: INTEL CORPORATION, Santa Clara, CA (US)

(72) Inventors: Sansaptak Dasgupta, Hillsborough, OR (US); Prashant Majhi, San Jose, CA (US); Han Wui Then, Portland, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 63 days.

(21) Appl. No.: 16/303,485

(22) PCT Filed: Jun. 30, 2016

(86) PCT No.: PCT/US2016/040260
§ 371 (c)(1),
(2) Date: Nov. 20, 2018

(87) PCT Pub. No.: WO2018/004581
PCT Pub. Date: Jan. 4, 2018

(65) Prior Publication Data
US 2020/0119030 A1    Apr. 16, 2020

(51) Int. Cl.
*H01L 27/11* (2006.01)
*H01L 27/11556* (2017.01)
(Continued)

(52) U.S. Cl.
CPC .... *H01L 27/11556* (2013.01); *H01L 21/0254* (2013.01); *H01L 21/02381* (2013.01);
(Continued)

(58) Field of Classification Search
CPC ........................... H01L 27/0727; H01L 28/40
See application file for complete search history.

(56) References Cited

U.S. PATENT DOCUMENTS 9,608,000 B2 * 3/2017 Hopkins ........... H01L 27/11556
10,388,665 B1 * 8/2019 Xie ..................... H01L 21/0228
(Continued)

FOREIGN PATENT DOCUMENTS

WO   2018004581 A1   1/2018

OTHER PUBLICATIONS

International Search Report and Written Opinion received for Patent Application No. PCT/GB2016/040260, dated Mar. 31, 2017. 14 pages.

(Continued)

*Primary Examiner* — Caridad Everhart
*Assistant Examiner* — Ankush K Singal
(74) *Attorney, Agent, or Firm* — Finch & Maloney PLLC

(57) ABSTRACT

Techniques are disclosed for forming three-dimensional (3D) NAND structures including group III-nitride (III-N) material channels. Typically, polycrystalline silicon (poly-Si) channels are used for 3D NAND structures, such as 3D NAND flash memory devices. However, using III-N channel material for 3D NAND structures offers numerous benefits over poly-Si channel material, such as relatively lower resistance in the channel, relatively higher current densities, and relatively lower leakage. Therefore, using III-N channel material enables an increased number of floating gates or storage cells to be stacked in 3D NAND structures, thereby leading to increased capacity for a given integrated circuit footprint (e.g., increased $GB/cm^2$). For instance, use of III-N channel material can enable greater than 100 floating gates for a 3D NAND structure. Other embodiments may be described and/or disclosed.

20 Claims, 14 Drawing Sheets

(51) Int. Cl.
  *H01L 29/08* (2006.01)
  *H01L 29/20* (2006.01)
  *H01L 29/788* (2006.01)
  *H01L 29/36* (2006.01)
  *H01L 29/423* (2006.01)
  *H01L 21/02* (2006.01)
  *H01L 29/10* (2006.01)
  *H01L 21/28* (2006.01)
  *H01L 21/311* (2006.01)
  *H01L 21/3213* (2006.01)
  *H01L 29/205* (2006.01)

(52) U.S. Cl.
  CPC .. *H01L 21/02458* (2013.01); *H01L 21/31111* (2013.01); *H01L 21/32133* (2013.01); *H01L 29/0847* (2013.01); *H01L 29/1037* (2013.01); *H01L 29/2003* (2013.01); *H01L 29/205* (2013.01); *H01L 29/36* (2013.01); *H01L 29/40114* (2019.08); *H01L 29/42324* (2013.01); *H01L 29/7883* (2013.01)

(56) References Cited

U.S. PATENT DOCUMENTS

| | | | |
|---|---|---|---|
| 2012/0132981 A1* | 5/2012 | Imamura | H01L 27/11556 257/321 |
| 2012/0280280 A1* | 11/2012 | Zhang | H01L 29/7786 257/194 |
| 2013/0153917 A1 | 6/2013 | Romano et al. | |
| 2014/0160841 A1* | 6/2014 | Koval | H01L 29/40114 365/185.01 |
| 2014/0162418 A1 | 6/2014 | Keshav et al. | |
| 2014/0264532 A1* | 9/2014 | Dennison | H01L 29/66833 257/316 |
| 2014/0264533 A1 | 9/2014 | Simsek-Ege et al. | |
| 2015/0287734 A1 | 10/2015 | Simsek-Ege et al. | |
| 2015/0364488 A1 | 12/2015 | Pachamuthu et al. | |
| 2017/0179115 A1* | 6/2017 | Wang | H01L 29/7786 |

OTHER PUBLICATIONS

International Preliminary Report on Patentability received for Patent Application No. PCT/GB2016/040260, dated Jan. 10, 2019. 11 pages.

* cited by examiner

US 10,727,241 B2

3D NAND STRUCTURES INCLUDING GROUP III-N MATERIAL CHANNELS

BACKGROUND

There are numerous types of semiconductor memory. Some memory is volatile and will lose its contents if power is removed. Some memory is non-volatile and will hold the information stored in the memory even after power has been removed. One type of non-volatile memory is flash memory. In a floating gate flash memory cell, a conductive floating gate, positioned between the control gate and the channel of a metal-oxide silicon field effect transistor (MOSFET), is used to store a charge and is thus referred to as a charge storage region. The threshold voltage of the MOSFET-based flash cell can be changed by changing the amount of charge stored in the charge storage region of the cell, and the threshold voltage can be used to indicate a value that is stored in the flash cell. One architecture for flash memories is a NAND flash architecture that utilizes negative-AND (NAND) logic gates. In a NAND flash architecture, two or more flash cells are coupled together, source to drain, into a string, with the individual cell control gates coupled to control lines, such as word lines. Select gates, which may be implemented with standard MOSFETs and are generally used during cell read and write operations, may be coupled to the NAND string at either end, to couple the NAND string to a source line at one end of the NAND string, and to a bit line at the other end of the NAND string.

Recently, NAND technology has gone vertical to form three-dimensional (3D) NAND structures. 3D NAND flash memory is suitable for the same types of applications that planar NAND (or 2D NAND) flash memory has been used, such as for solid-state memory. A stack of flash cells may include any number of flash cells with the source, channel, and drain arranged vertically so that as the cells are positioned, one on top of the other, they form a vertical NAND string. The vertical or 3D NAND string may be positioned on top of a select gate that may couple the string to a source line and may have another select gate positioned on top of the 3D NAND string to couple the string to a bit line. 3D NAND flash memory technology improves on planar NAND flash memory by stacking storage cells to increase capacity through higher density and lower cost per gigabyte, and 3D NAND also meets reliability, speed, and performance expectations for solid-state memory.

Figure 1:
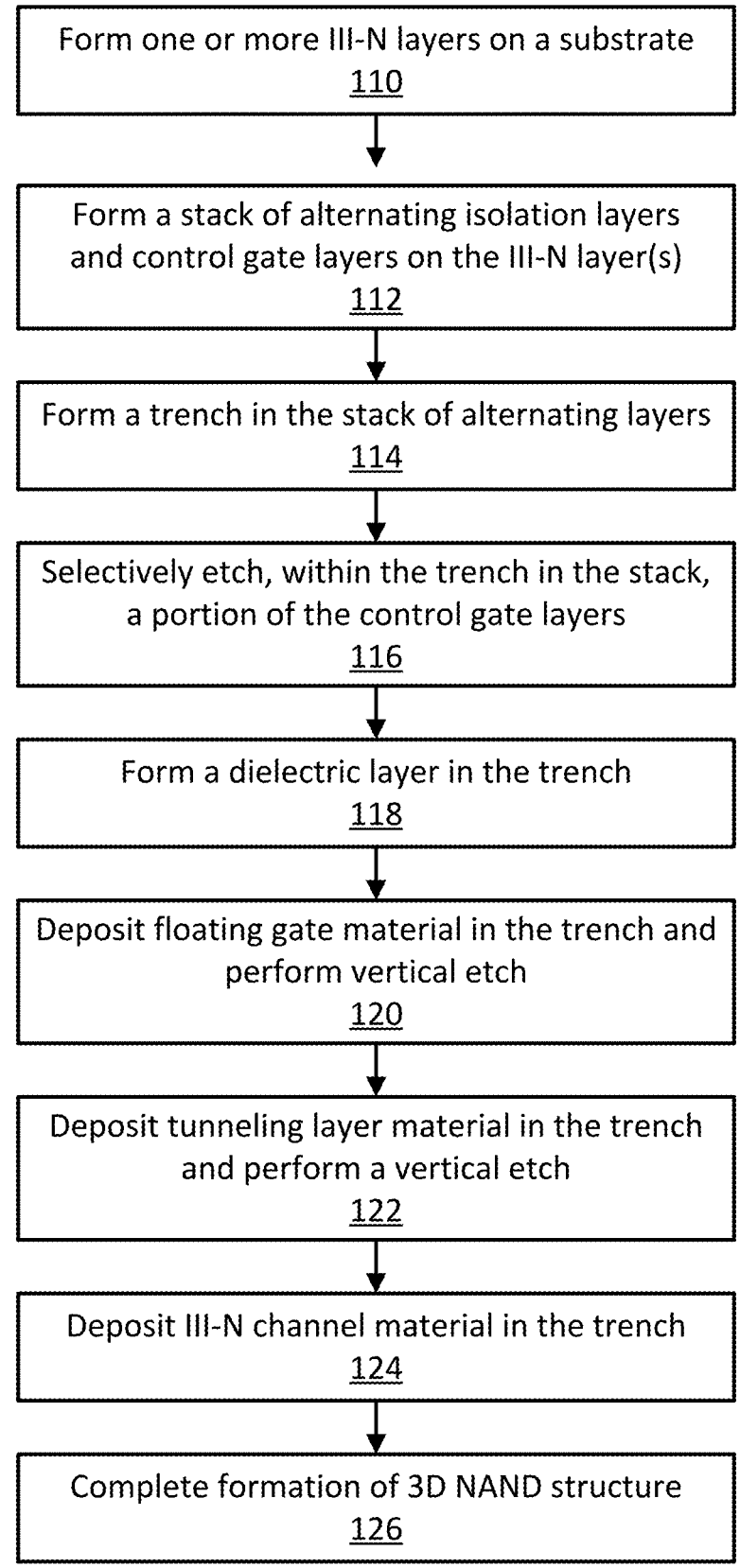
FIG. 1 illustrates an example method of forming an integrated circuit (IC) including a 3D NAND structure that includes a group III-N material channel, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is primarily provided to assist in visually differentiating the different features. In short, the figures are provided merely to show example structures.

DETAILED DESCRIPTION

For 3D NAND technology, typical transistor channels are implemented with polysilicon (poly-Si) and present numerous drawbacks. For instance, as 3D NAND is scaled, the poly-Si channel 3D NAND structures are limited in the number of floating gates or storage cells that can be stacked (e.g., no greater than approximately 90 storage cells), due to the resistance in the channel becoming too high. These resistance issues occur as a result of the poly-Si channel conduction being dominated by grain size distribution and hampered by scattering events, leading to low on-state current.

Thus and in accordance with one or more embodiments of this disclosure, techniques are provided for forming 3D NAND structures including group III-N material channels. For example, in some embodiments, 3D NAND structures disclosed herein include a substrate, a III-N nucleation layer, a III-N source layer, a stack of alternating isolation layers (e.g., oxide layers) and control gate layers, and a III-N channel region between the stack of alternating layers. A dielectric layer, floating gate, and tunneling layer (e.g., a tunneling layer) is located between the channel region and each control gate layer. In some such embodiments, one of the control gate layers (e.g., the bottom-most control gate layer) may instead be a select gate layer that can allow for the memory states stored in all floating gates above the select gate to be simultaneously erased in one voltage application (e.g., using a relatively high voltage). In some embodiments, the III-N channel region may include GaN and/or InGaN. In some embodiments, the III-N channel region material may have a crystalline structure or a polycrystalline structure, depending upon the underlying material from which the III-N channel region material is grown. In some embodiments, the III-N channel region may be lightly doped, such as being lightly doped with a suitable n-type dopant (e.g., using Si as the dopant) with the dopant ranging between 1E16 and 2E18 atoms per cubic cm, for example. In some embodiments, the III-N channel region may have a multilayer structure including at least two III-N materials. In some embodiments, the III-N channel region may include grading (e.g., increasing and/or decreasing) the content of one or more materials throughout the region. For example, in some such embodiments, an InGaN channel may have the indium content graded from the bottom of the channel region to the top of the channel region and/or included dopant material may be graded in the channel region. Numerous III-N channel configurations for 3D NAND will be apparent in light of the present disclosure.

As used herein, group III-N material (or III-N material or III-N) includes a compound of one or more group II elements (e.g., aluminum, gallium, indium, boron, thallium), with nitrogen. Accordingly, III-N material as used herein includes, but is not limited to, gallium nitride (GaN), indium nitride (InN), aluminum nitride (AlN), aluminum indium nitride (AlInN), aluminum gallium nitride (AlGaN), indium gallium nitride (InGaN), and aluminum indium gallium nitride (AlInGaN). Group III-N material provides numerous benefits over poly-Si for the channel of 3D NAND. For example, III-N material can be epitaxially grown for 3D NAND channels and can provide greater than ten times the amount of conductance as compared to poly-Si 3D NAND channels. For instance, III-N channel material can exceed mobilities of 1000 $cm^2/(V*s)$, while poly-Si channel material mobility can only reach 100 $cm^2/(V*s)$. In addition, using III-N material for 3D NAND channels power loss benefits compared to poly-Si material, enabling up to one hundred times less gate leakage compared to poly-Si 3D NAND channels. Moreover, while maintaining relatively low leakage, III-N channel 3D NAND can lead to higher current densities (e.g., greater than 100 times higher) as compared to poly-Si technologies used for 3D NAND. Accordingly, more floating gates or storage cells can be stacked using a III-N channel 3D NAND as compared to poly-Si channel 3D NAND, thereby leading to increased capacity for a given 3D NAND footprint (e.g., increased $GB/cm^2$). For example, the techniques and III-N channel 3D NAND structures described herein can enable well over 100 floating gates, such as upwards of 1000 floating gates, as will be apparent in light of this disclosure.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate a 3D NAND structure including a group III-N material channel. In some such embodiments, the 3D NAND structure may include a stack of multiple storage cells, such as at least 2, 5, 10, 25, 50, 75, 100, 150, 200, 250, 300, 400, 500, or 1000 storage cells, or some other suitable threshold amount, as will be apparent in light of this disclosure. In some embodiments, the techniques and structures described herein may be detected based on the benefits derived from using III-N channel material for a 3D NAND structure, such as the increased mobility/conduction benefits and/or the power consumption. Numerous configurations and variations will be apparent in light of this disclosure.

Methodology and Architecture

FIG. 1 illustrates an example method 100 of forming an integrated circuit (IC) including a 3D NAND structure that includes a group III-N material channel, in accordance with some embodiments of the present disclosure. FIGS. 2A-H illustrate example IC structures formed when carrying out method 100 of FIG. 1, in accordance with some embodiments. As will be apparent in light of the structures formed, method 100 is related to techniques for forming a 3D NAND structure (e.g., 3D NAND flash memory device) including a group III-N material channel. As will be apparent in light of this disclosure, the use of such high conductance, high quality epitaxial III-N materials for channel of 3D NAND structures can lead to high current densities (e.g., greater than 100×) while maintaining low leakage as compared to poly-Si channel 3D NAND. Method 100 and the structures of FIGS. 2A-H are provided as examples to help illustrate techniques for forming a III-N channel 3D NAND structure and are not intended to limit the present disclosure.

Figure 2A:
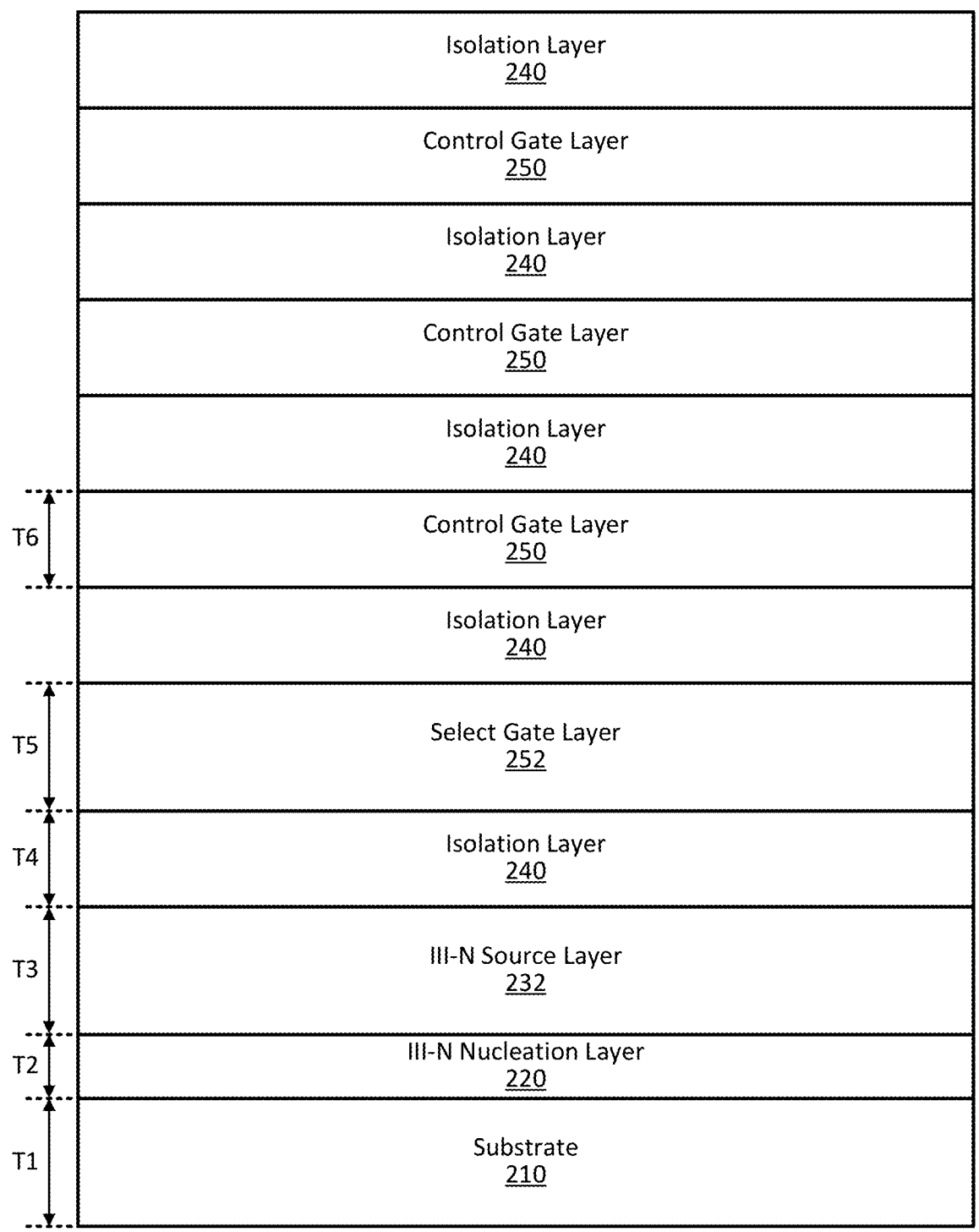
FIGS. 2A-H illustrate example IC structures formed when carrying out method of FIG. 1, in accordance with some embodiments.
Figure 2A:
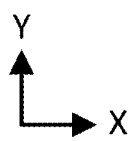

Method 100 of FIG. 1 includes forming 110 one or more III-N layers on a substrate, in accordance with an embodiment. As shown in FIG. 2A, two III-N layers were formed on substrate 210, which includes III-N nucleation layer 220 and III-N source layer 232, in this example embodiment. As previously described, group III-N material (or III-N material or III-N) includes a compound of one or more group III elements (e.g., aluminum, gallium, indium, boron, thallium), with nitrogen. Accordingly, III-N material as used herein includes, but is not limited to, gallium nitride (GaN), indium nitride (InN), aluminum nitride (AlN), aluminum indium nitride (AlInN), aluminum gallium nitride (AlGaN), indium gallium nitride (InGaN), and aluminum indium gallium nitride (AlInGaN).

Substrate 210, in some embodiments, may include: a bulk substrate including a group IV material, such as silicon (Si), germanium (Ge), silicon germanium (SiGe), or silicon carbide (SiC), and/or at least one group III-V material and/or sapphire and/or any other suitable material(s) as will be apparent in light of this disclosure; an X on insulator (XOI) structure where X is one of the aforementioned materials (e.g., group IV and/or group III-V and/or sapphire) and the insulator material is an oxide material or dielectric material or some other electrically insulating material; or some other suitable multilayer structure where the top layer includes one of the aforementioned materials (e.g., group IV and/or group III-V and/or sapphire). Note that group IV material as used herein includes at least one group IV element (e.g., carbon, silicon, germanium, tin, lead), such as Si, Ge, SiGe, or SiC to name some examples. Note that group III-V material as used herein includes at least one group III element (e.g., aluminum, gallium, indium, boron, thallium) and at least one group V element (e.g., nitrogen, phosphorus, arsenic, antimony, bismuth), such as gallium arsenide (GaAs), gallium nitride (GaN), indium gallium arsenide (InGaAs), and indium gallium nitride (InGaN), to name some examples. In some embodiments, substrate 210 may be doped with one or more materials, such as including p-type or n-type impurity doping of any suitable concentration, for example. In some embodiments, substrate 210 may include a surface crystalline orientation described by a Miller Index of <100>, <110>, or <111>, or its equivalents, as will be apparent in light of this disclosure. For instance, in an example embodiment, substrate 210 may be an n-type doped Si substrate having a <100> surface orientation with a miscut or offcut of 2-10 degrees in the <110> direction. Although substrate 210, in this example embodiment, is shown as having a thickness T1 (the dimension in the Y direction) similar to the other layers for ease of illustration, in some instances, substrate 210 may be much thicker than the other layers, such as having a thickness in the range of 50 to 950 microns, for example. In some embodiments, substrate 210 may be used for one or more other IC devices, such as various diodes (e.g., light-emitting diodes (LEDs) or laser diodes), various transistors (e.g., MOSFETs and/or TFETs), various capacitors (e.g., MOSCAPs), various microelectromechanical systems (MEMS), various nano-electromechanical systems (NEMS), various sensors, or any other suitable semiconductor or IC devices, depending on the end use or target application. Accordingly, in some embodiments, the structures described herein may be included in a system-on-chip (SoC) application, as will be apparent in light of this disclosure.

Figure 3:
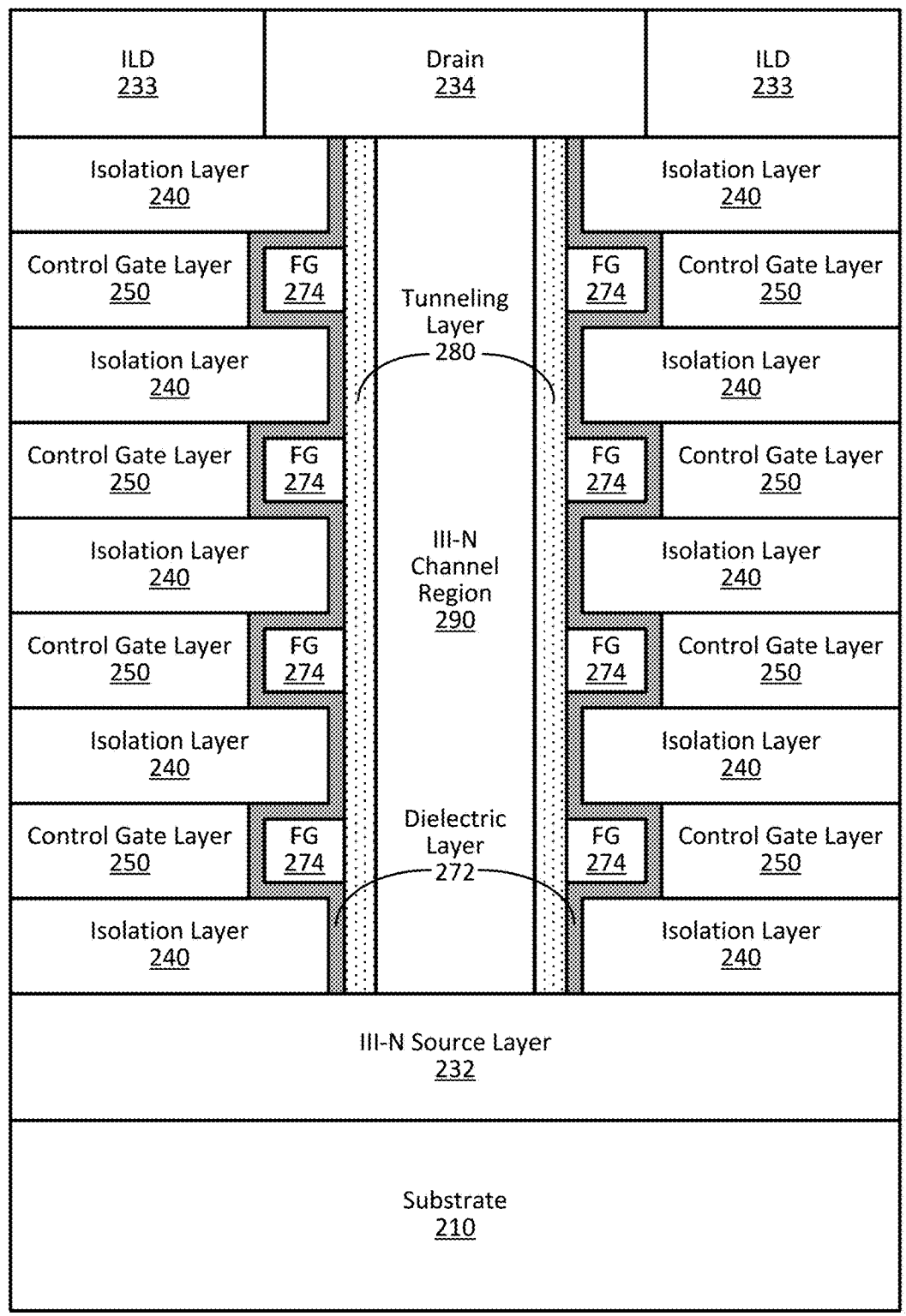
FIG. 3 illustrates the example structure of FIG. 2H, including two variations, in accordance with some embodiments of the present disclosure. The two variations include that there is no III-N nucleation layer present in the example structure of FIG. 3 and there is also no select gate layer.

III-N nucleation layer 220, in some embodiments, may be present to, for example, improve growth conditions and/or prevent subsequent III-N layers (e.g., III-N source layer 232) from reacting with the material of substrate 210 in an undesired manner, as will be apparent in light of this disclosure. In other words, in some embodiments, nucleation layer 220 may be considered a seeding layer and may be present to assist with the growth of III-N source layer 232, particularly where substrate 210 is a non-III-V material substrate (e.g., such as a Si substrate), for example. In some embodiments, III-N nucleation layer 220 may be formed using any suitable techniques, such as blanket depositing/growing the layer 220 material on substrate 210 using, for example, metal-organic chemical vapor deposition (MOCVD), molecular-beam epitaxy (MBE) chemical vapor deposition (CVD), atomic layer deposition (ALD), physical vapor deposition (PVD), and/or any other suitable processes as will be apparent in light of this disclosure. In some embodiments, III-N nucleation layer 220 may only be formed on and/or above substrate 210 in areas where the 3D NAND structures as described herein are to be formed, for example. In some embodiments, nucleation layer 220, may include any suitable III-N material, such as AlN or a low temperature GaN layer (e.g., epitaxially grown at a temperature in the range of 700 to 950 degrees Celsius), for example. In some embodiments, III-N nucleation layer 220 may include dopants of one or more materials (e.g., using Si, if the material is n-type doped). In some embodiments, nucleation layer 220, may have any suitable thickness T2 (dimension in the Y direction), such as a thickness of 10 nm to 2 microns (e.g., 200 nm to 1 micron), or any other suitable thickness as will be apparent in light of this disclosure. Note that in some embodiments, III-N nucleation layer 220 need not be present, and III-N source layer 232 may be formed directly on substrate 210 or on some other suitable layer, such as is shown in FIG. 3, for example.

III-N source layer 232, in some embodiments, may be present to provide the source for the 3D NAND structure, as will be apparent in light of this disclosure. In some embodiments, III-N source layer 232 may be formed using any suitable techniques, such as blanket depositing/growing the layer 232 (e.g., on nucleation layer 220) using any of the aforementioned techniques, such as MOCVD, MBE, CVD, ALD, PVD, and/or any other suitable processes as will be apparent in light of this disclosure. In some embodiments, III-N source layer 232 may only be formed above substrate in areas where the 3D NAND structures as described herein are to be formed, for example. In some embodiments, source layer 232 may include any suitable III-N material, such as InGaN or GaN, for example. In some embodiments, III-N source layer 232 may include dopants of one or more materials. For example, in some such embodiments, III-N source layer 232 may be heavily doped (e.g., using Si, if the material is n-type doped), such as on the order of at least 2E19, 2E20, or 2E21 atoms per cubic cm, or any other suitable threshold amount as will be apparent in light of this disclosure. In some embodiments, III-N source layer 232 may have a multilayer structure including multiple III-N materials. In some embodiments, III-N source layer 232 may or may not include grading (e.g., increasing and/or decreasing) the content of one or more materials in at least a portion of the layer. In some embodiments, III-N source layer 232 may have any suitable thickness T3 (dimension in the Y direction), such as a thickness of 20 to 300 nm (e.g., 50 to 150 nm), or any other suitable thickness as will be apparent in light of this disclosure. Note that in some embodiments, the source layer need not include a III-N material, but instead may include any suitable electrically conductive material, such as a metal or metal alloy (e.g., titanium nitride (TiN) or copper), as can be understood based on this disclosure. For example, in some such embodiments, where source layer includes a metal or metal alloy material, it may be considered metallization layer M0. In some embodiments, one or more additional III-N material layers may be formed during process 110, as can be understood based on this disclosure.

Method 100 continues with forming 112 a stack of alternating isolation layers and control gate layers on the III-N layers to form the example structure of FIG. 2A, in accordance with an embodiment. In some cases, the alternating layers of isolation material and control gate material may be considered wordline tiers, as they can be used for 3D NAND flash memory, as can be understood based on this disclosure. As shown in the example structure of FIG. 2A, the alternating stack of layers includes isolation layers 240 and control gate layers 250, as well as a select gate layer 252 formed in the place of the first or bottom-most control gate layer 250. More specifically, a first isolation layer 240 was formed on III-N source layer 232, select gate layer 252 was formed on that first isolation layer 240, followed by alternating isolation layers 240 and control gate layers 250, as can be seen. In this example embodiment, select gate layer 252 may be included to allow for the memory states stored in all floating gate cells above the select gate layer 252 to be simultaneously erased in one voltage application (e.g., using a relatively high voltage), as can be understood based on this disclosure. Select gate layer 252 will be described in more detail herein. However, in some embodiments, select gate layer 252 need not be present in the stack of layers, such as is shown in FIG. 3, for example. In some embodiments, the stack of alternating layers may be formed in any suitable shape (from a downward view of the stack, such as looking along the Y-axis), such as a circular, square, or rectangular shape, or any other suitable shape as can be understood based on this disclosure. In this example embodiment, three control gate layers 250 are formed in the stack, which will translate to three floating gate (or storage) cells in the 3D NAND flash memory structure. Thus, if a 3D NAND structure is desired with, for example, 100 NAND gates, at least 100 sets of isolation layers 240 and control gate layers 250 will be formed in the stack, as can be understood based on this disclosure. However, the present disclosure is not intended to be limited to any particular number of alternating layers 240/250 in the stack and thus it is not intended to be limited to any specific number of storage cells, unless otherwise stated. For example, as described herein, use of a III-N channel in the 3D NAND structure enables including greater than 90 storage cells (an approximate limit for poly-Si channel 3D NAND structures). Accordingly, the number of control gate layers 250 formed in the stack at this point in method 100 (and thus, the number of storage cells subsequently formed in the resulting 3D NAND structure) may be in the range of 1 to 1000 control gate layers 250 (with an isolation layer 240 between each control gate layer 250), or any other suitable number as will be apparent in light of the present disclosure.

Isolation layers 240, in some embodiments, may be formed using any suitable techniques, such as blanket depositing/growing the layers 240 in the stack using any of the aforementioned techniques, such as MOCVD, MBE, CVD, ALD, PVD, and/or any other suitable processes as will be apparent in light of this disclosure. In some embodiments, isolation layers 240 may be formed in a step-wise manner to allow for making contact to the other layers in the stack, such as select gate layer 252 and control gate layers 250, as will be described in more detail with reference to FIG. 6, for example. In some embodiments, isolation layers 240 may include any suitable electrically insulating material, such as an oxide (e.g., silicon oxide, aluminum oxide, hafnium oxide), a nitride (e.g., silicon nitride), a carbide (e.g., silicon carbide), a dielectric material, and/or any other suitable material as will be apparent in light of this disclosure. In some embodiments, isolation layers 240 may have a multilayer structure including multiple materials. In some embodiments, isolation layers 240 may or may not include grading (e.g., increasing and/or decreasing) the content of one or more materials in at least a portion of each layer. In some embodiments, isolation layers 240 may have any suitable thickness T4 (dimension in the Y direction), such as a thickness of 10 to 400 nm (e.g., 20 to 200 nm), or any other suitable thickness as will be apparent in light of this disclosure. Note that in some embodiments, isolation layers 240 may all have the same or similar thicknesses and material, while in other embodiments, one or more of the isolation layers 240 may be selected to have different thicknesses and/or materials, depending on the specific desired configuration. For instance, in some embodiments, the first and/or last isolation layer 240 in the stack may be formed to be relatively thicker than the other isolation layers 240 in the stack to, for example, assist with isolation for the stack. Further note that in the stack of FIG. 2A, an extra isolation layer 240 is formed on the top of the stack, such that each control gate layer 250 has an isolation layer 240 directly above and directly below each control gate layer 250, in this example embodiment.

Select gate layer 252 and control gate layers 250, in some embodiments, may be formed using any suitable techniques, such as MOCVD, MBE, CVD, ALD, PVD, and/or any other suitable processes as will be apparent in light of this disclosure. In some embodiments, formation of select gate layer 252 and control gate layers 250 may be formed on and extend approximately the width (dimension in the X direction) of the respective underlying isolation layer 240, such as in a step-wise manner to allow for making contact to gate layers 252 and 250, as will be described in more detail with reference to FIG. 6, for example. In some embodiments, select gate layer 252 and control gate layers 250 may include any suitable electrically conductive material, such as a metal nitride or metal alloy nitride (e.g., tantalum nitride (TaN) or titanium nitride (TiN)), polycrystalline silicon (poly-Si), a metal or metal alloy (e.g., tungsten (W)), and/or any other suitable material as will be apparent in light of this disclosure. In some embodiments, select gate layer 252 and/or control gate layers 250 may have a multilayer structure including multiple materials. In some embodiments, select gate layer 252 and/or control gate layers 250 may or may not include grading (e.g., increasing and/or decreasing) the content of one or more materials in at least a portion of each layer. In some embodiments, select gate layer 252 may have any suitable thickness T5 (dimension in the Y direction), such as a thickness of 10 to 300 nm (e.g., 20 to 100 nm), or any other suitable thickness as will be apparent in light of this disclosure. In some embodiments, control gate layers 250 may have any suitable thickness T6 (dimension in the Y direction), such as a thickness of 10 to 300 nm (e.g., 20 to 100 nm), or any other suitable thickness as will be apparent in light of this disclosure. In some embodiments, select gate layer 252 may have a greater thickness T5 than the thickness T6 of control gate layers 250, such as T5 being at least 5, 10, 15, 20, 25, 50, or 100 nm thicker than T6, for example. In some embodiments, the thickness T5 of select gate layer 252 may be expressed as a ratio relative to the thickness T6 of control gate layers 250, such as a T5:T6 ratio of at least 1, 1.1, 1.2, 1.3, 1.4, 1.5, 2, 2.5, or 3, for example. In some such embodiments, select gate layer 252 may be relatively thicker than control gate layers 250 to enable application of a very high voltage to the layer 252 to erase all overlying floating gate cells in one such high voltage application, for example. In some embodiments, isolation layers 240 may be relatively thicker than control gate layers 250, such that T4 is greater than T6, for example. Note that in some embodiments, control gate layers 250 may all have the same or similar thicknesses and material, while in other embodiments, one or more of the control gate layers 250 may be selected to have different thicknesses and/or materials, depending on the specific desired configuration. Further note that in some embodiments, any number of select gate layers 252 may be present in the stack of alternating isolation layers 240 and control gate layers 250, such as 0, 1, 2, 3, 4, 5, or any other suitable number as will be apparent in light of this disclosure. In embodiments including multiple select gate layers 252, more than one select gate layer may be included to allow for sections of floating gate cells to be erased with one voltage application to a given select gate layer (e.g., where only floating gate cells above the given select gate layer are erased when such a voltage application is performed).

Figure 2B:
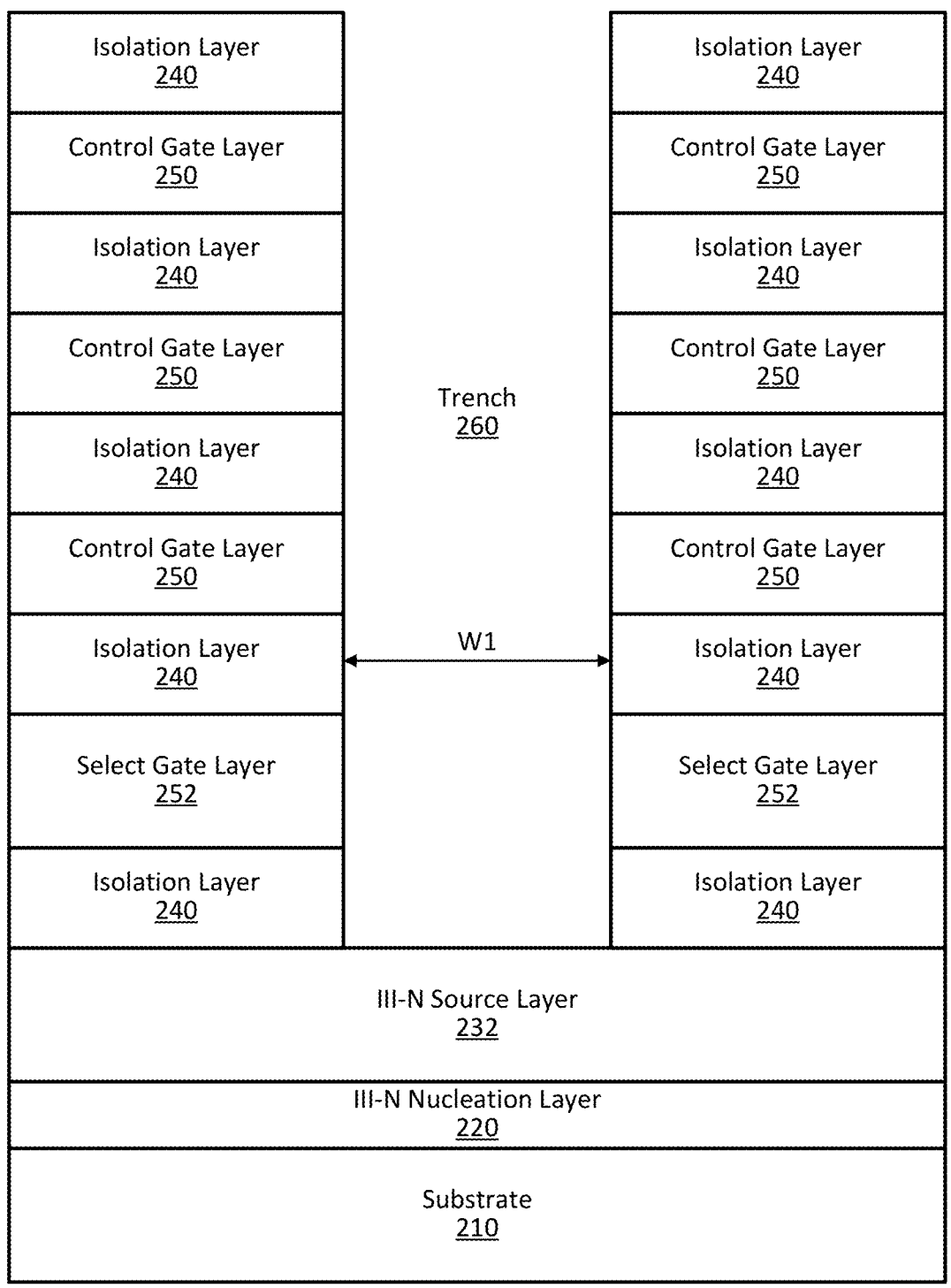

Method 100 of FIG. 1 continues with forming 114 a trench in the stack of alternating layers in the structure of FIG. 2A to form the example structure of FIG. 2B, in accordance with an embodiment. As shown in FIG. 2B, trench 260 has been formed in the stack, which includes isolation layers 240, control gate layers 250, and select gate layer 252, in this example embodiment. In some embodiments, trench 260 can be formed using any suitable techniques, such as forming a mask on the top of the structure shown in FIG. 2A, opening the mask in the area to be opened, etching to form trench 260, and/or any other suitable processes as will be apparent in light of this disclosure. In some such embodiments, a dry etch process may be used to simultaneously etch away layers 240, 250, and 252 as shown, for example. Further, in some such embodiments, III-N source layer 232 may serve as an etch stop layer for the trench 260 etch, for example. In some embodiments, trench 260 is primarily performed along the Y-axis and may have any suitable shape, such as a circular, square, or rectangular shape, or any other suitable shape as can be understood based on this disclosure. In some embodiments, trench 260 may be formed to have any suitable width W1 (dimension in the X direction), such as a width of 10 to 400 nm (e.g., 20 to 200 nm), or any other suitable width as will be apparent in light of this disclosure.

Figure 2C:
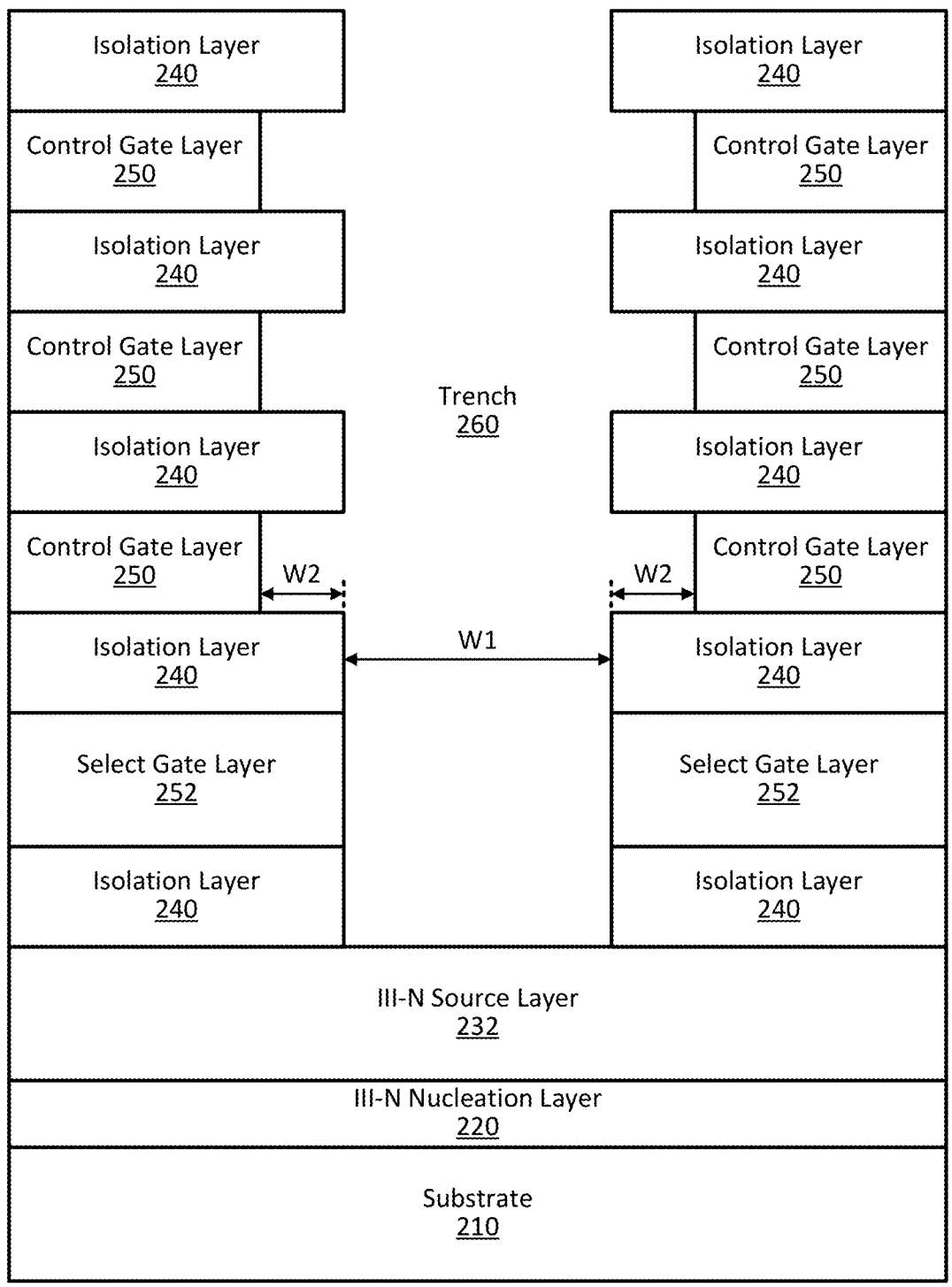

Method 100 of FIG. 1 continues with selectively etching 116, within the trench in the stack of FIG. 2B, a portion of the control gate layers to form the example structure of FIG. 2C, in accordance with an embodiment. As shown in FIG. 2C, control gate layers 250 have been selectively etched or recessed back by a width (the dimension in the X direction) of W2 on both sides of trench 260. In some embodiments, selective etch 116 can be performed using any suitable techniques, such as using a wet etch process with an etchant that removes the material of control gate layers 250 at a faster rate than the etchant removes the material of isolation layers 240, for example. In some such embodiments, the etchant may remove the material of control gate layers 250 relative to removing the material of isolation layers 240 at a rate of at least 2, 5, 10, 15, 20, 25, 50, or 100 times faster, or any other suitable minimum threshold as will be apparent in light of this disclosure. Accordingly, in some embodiments, the material of isolation layers 240 and control gate layers 250 may be selected to accommodate the selective etch process and allow control gate layers 250 to be recessed and form the structure of FIG. 2C. Note that in some embodiments, the material of select gate layer 252 may be different than the material of control gate layers 250, such that the material of select gate layer 252 is not removed at the same rate (e.g., is removed slower or not at all) as the material of the control gate layer 250 during selective etch 116, for example. Further note that although it appears that the material of isolation layers 240 (and the material of the other layers outside of control gate layers 250) is unaffected by selective etch 116, in some embodiments, that need not be the case. For example, the etchant used for selective etch 116 may remove some material from other layers, as well, though, such removal may be at a relatively slower rate than the removal of the material from control gate layers 250, as can be understood based on this disclosure. As will be apparent in light of this disclosure, control gate layers 250 may be recessed to allow for the formation of floating gate material in at least a portion of the recessed space. In some embodiments, control gate layers 250 may be recessed by any suitable width W2 (dimension in the X direction), such as width of 5 to 40 nm (e.g., 10 to 20 nm), or any other suitable width as will be apparent in light of this disclosure.

Figure 2D:
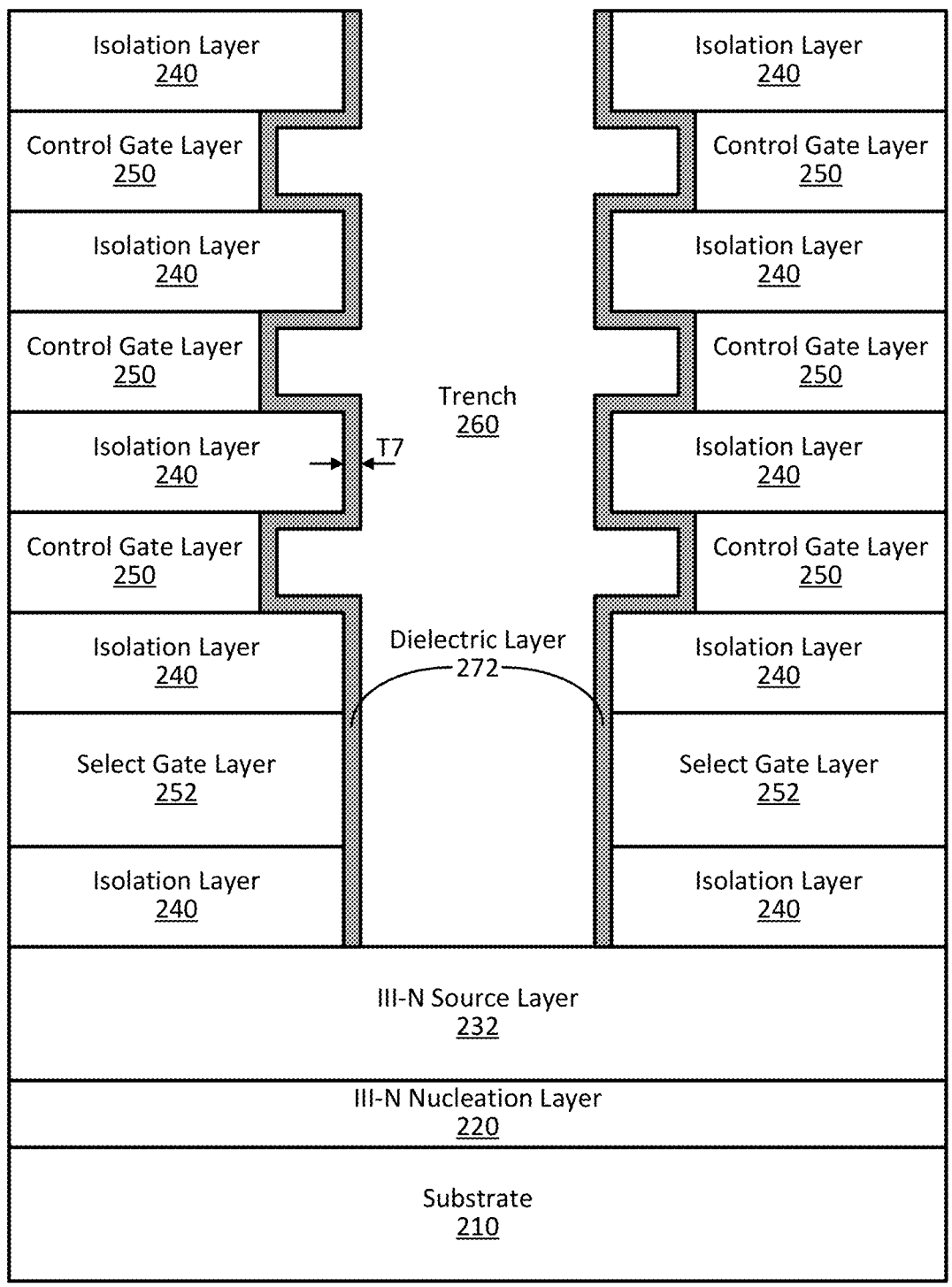

Method 100 of FIG. 1 continues with forming 118 a dielectric layer in the trench of FIG. 2C to form the example structure of FIG. 2D, in accordance with an embodiment. As shown in FIG. 2D, dielectric layer 272 is formed on both sides of trench 260 and is formed in a conformal manner, such that dielectric layer 272 tracks with the topography of trench 260. In some embodiments, dielectric layer 272 may be formed using any suitable techniques, such as using an ALD deposition process to conformally deposit the dielectric layer 272 material, for example. In some embodiments, a vertical etch may be performed to remove dielectric layer 272 from the bottom of trench 260, such as in cases where it forms on III-N source layer 232. In some such embodiments, the vertical etch may also remove the dielectric layer 272 material from the sidewalls of trench 260, except for in the control gate layer 250 recess locations. In some embodiments, dielectric layer 272 may be considered a gate dielectric layer and may help isolate and/or electrically insulate subsequently formed floating gate material from control gate layers 250, as will be apparent in light of this disclosure. In some embodiments, dielectric layer 272 need not be present. In some embodiments, dielectric layer 272 may include any suitable dielectric material, such as silicon dioxide and/or high-k dielectric material, or any other suitable material as will be apparent in light of this disclosure. Example high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to name some examples. In some embodiments, an annealing process may be carried out on the dielectric layer 272 to improve its quality when, for example, a high-k dielectric material is used. In some embodiments, dielectric layer 272 may have any suitable thickness T7 (dimension in the X and Y direction as it conforms to the topography of trench 260), such as a thickness of 1 to 20 nm (e.g., 1 to 5 nm), or any other suitable thickness as will be apparent in light of this disclosure.

Figure 2E:
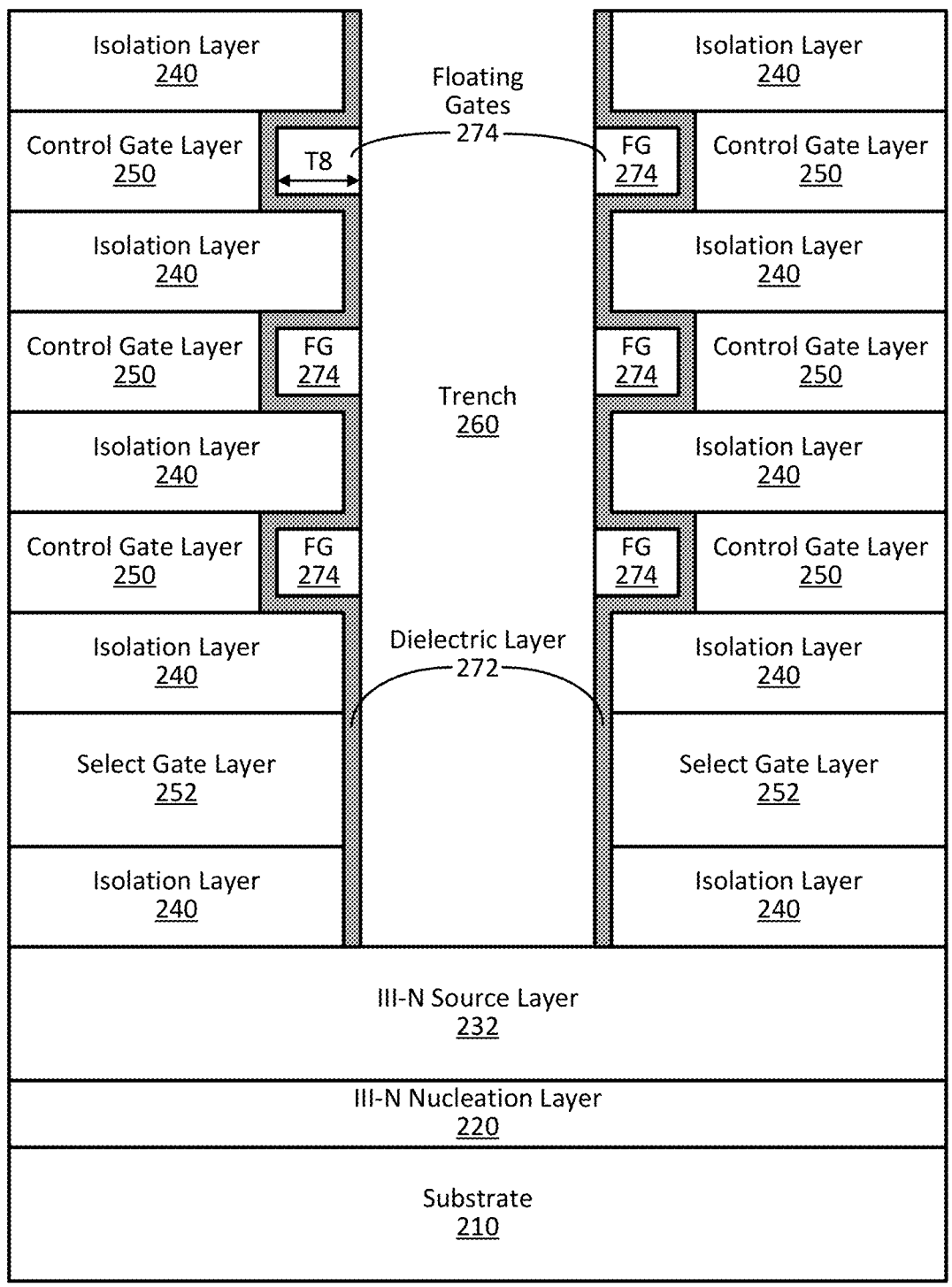

Method 100 of FIG. 1 continues with depositing 120 floating gate material in the trench of the structure of FIG. 2D and performing a vertical etch process to form the example structure of FIG. 2E, in accordance with an embodiment. As can be understood based on this disclosure, in some embodiments, floating gates 274 may be used as storage cells for a 3D NAND flash memory device. As shown in FIG. 2E, floating gate (FG) features or cells 274 were formed in the remaining space of the recesses formed in control gate layers 250. In some embodiments, floating gates 274 may be formed using any suitable techniques, such as depositing the floating gate material using an ALD and/or sputtering process, and/or any other suitable processes as will be apparent in light of this disclosure. In some embodiments, deposition of the floating gate material may fill up a majority of trench 260 and then a vertical etch process may be performed to remove all of the material except for a thickness of the material in the control gate layer 250 recesses, as shown in FIG. 2E. In some embodiments, deposition of the floating gate material may be formed in an isolated manner on the sidewalls (and possibly on the bottom) of trench 260 in FIG. 2D, which may or may not include a vertical etch to remove floating gate material and leave the floating gates 274 shown in FIG. 2E, for example. In some embodiments, floating gates 274 may include any suitable material, such as a metal or metal alloy (e.g., W, nickel (Ni), platinum (Pt), ruthenium (Ru)), a metal nitride or metal alloy nitride (e.g., TiN or TaN), silicon nitride (SiN), silicon oxynitride (SiON), aluminum gallium nitride (AlGaN), aluminum nitride (AlN), and/or any other suitable material as will be apparent in light of this disclosure. Note that for a given control gate layer 250, although it may appear that the left and right floating gates 274 are separate, in some embodiments, the floating gates 274 may be a single feature, such as in the case of a circular 3D NAND structure, where a single floating gate 274 wraps around trench 260 (and thus wraps around the channel), for example. In some embodiments, floating gates 274 may have any suitable thickness T8 (dimension in the X direction), such as a thickness of 1 to 20 nm (e.g., 1 to 10 nm), or any other suitable thickness as will be apparent in light of this disclosure.

Figure 2F:
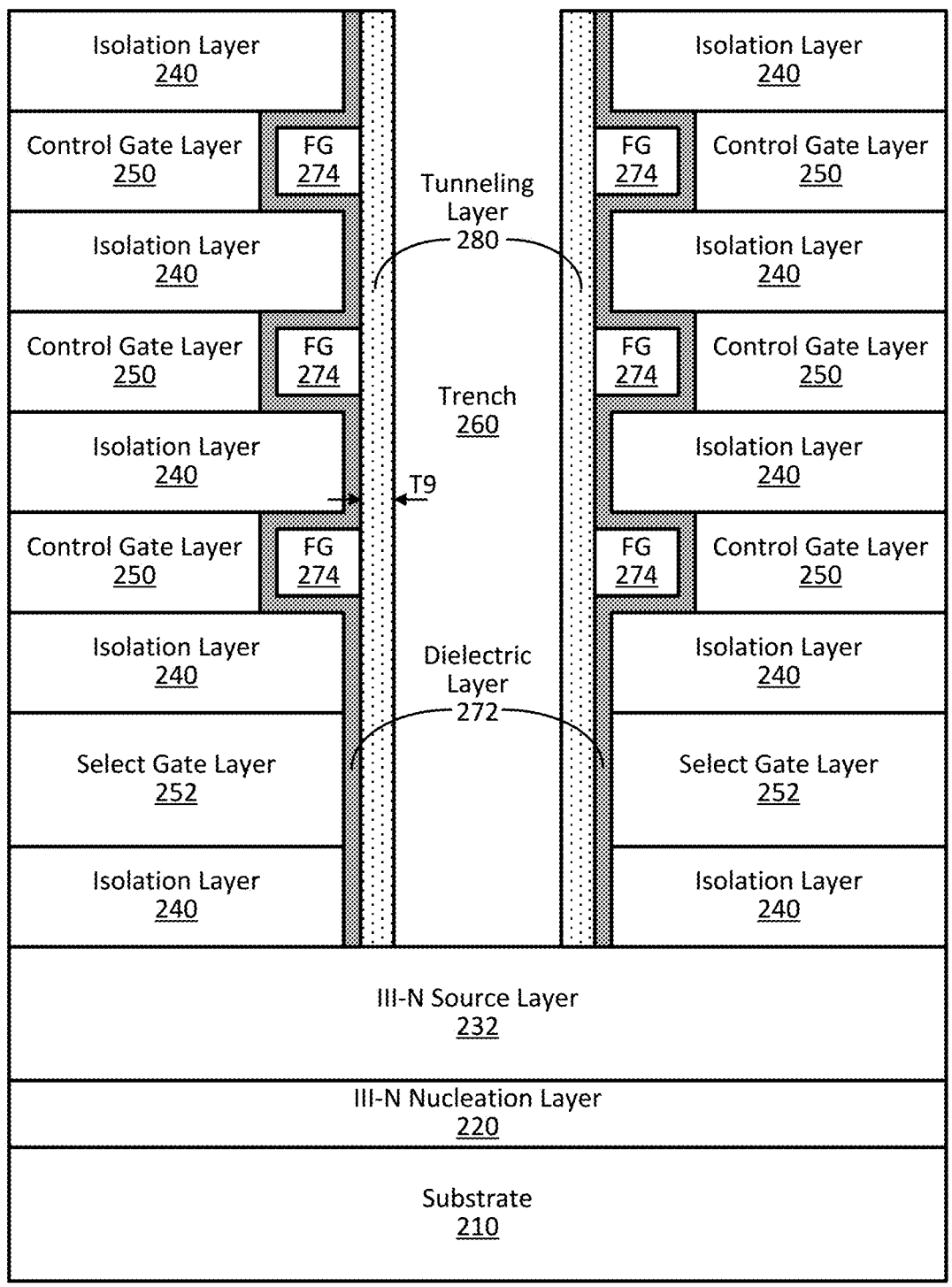

Method 100 of FIG. 1 continues with depositing 122 tunneling material in the trench of the structure of FIG. 2E and performing a vertical etch process to form the example structure of FIG. 2F, in accordance with an embodiment. As shown in FIG. 2F, tunneling layer 280 has been formed on the sidewalls of the trench 260 of the structure of FIG. 2E, in this example embodiment. Note that in some cases, tunneling layer 280 may be referred to as a tunnel oxide layer, especially in the context of 3D NAND flash memory devices. However, tunneling layer 280 need not include oxide material, and thus is referred to as a tunneling layer herein. As can be understood based on this disclosure, tunneling layer 280 may allow for charge carriers to move through the layer 280 to facilitate operation of a 3D NAND device, for example. In some embodiments, tunneling layer 280 may be formed using any suitable techniques, such as depositing the tunneling material using an ALD and/or sputtering process, and/or any other suitable processes as will be apparent in light of this disclosure. In some embodiments, deposition of the tunneling material may fill up a majority of trench 260 and then a vertical etch process may be performed to remove all of the material except for a thickness of the material on the trench 260 sidewalls, as shown in FIG. 2F. In some embodiments, deposition of the tunneling material may be formed in an isolated manner on the sidewalls (and possibly on the bottom) of trench 260 in FIG. 2E, which may or may not include a vertical etch to remove tunneling material at the bottom of the trench and leave the tunneling layer 280 shown in FIG. 2F, for example. In some embodiments, tunneling layer 280 may include any suitable material, such as an silicon dioxide ($SiO_2$), silicon nitride (SiN), silicon oxynitride (SiON), silicon oxycarbide (SiOC), aluminum silicon oxide (AlSiO), tantalum silicon oxide (TaSiO), hafnium oxide, other suitable oxide materials, and/or any other suitable material as will be apparent in light of this disclosure. In some embodiments, the material of tunneling layer 280 may be selected to increase compatibility with the III-N channel material, such as selecting an oxide material with a relatively lower k value (e.g., silicon dioxide or materials having k values slightly higher than 3.9, which is the k value of silicon dioxide). In some embodiments, tunneling layer 280 may have any suitable thickness T8 (dimension in the X direction), such as a thickness of 1 to 20 nm (e.g., 1 to 5 nm), or any other suitable thickness as will be apparent in light of this disclosure.

Figure 2G:
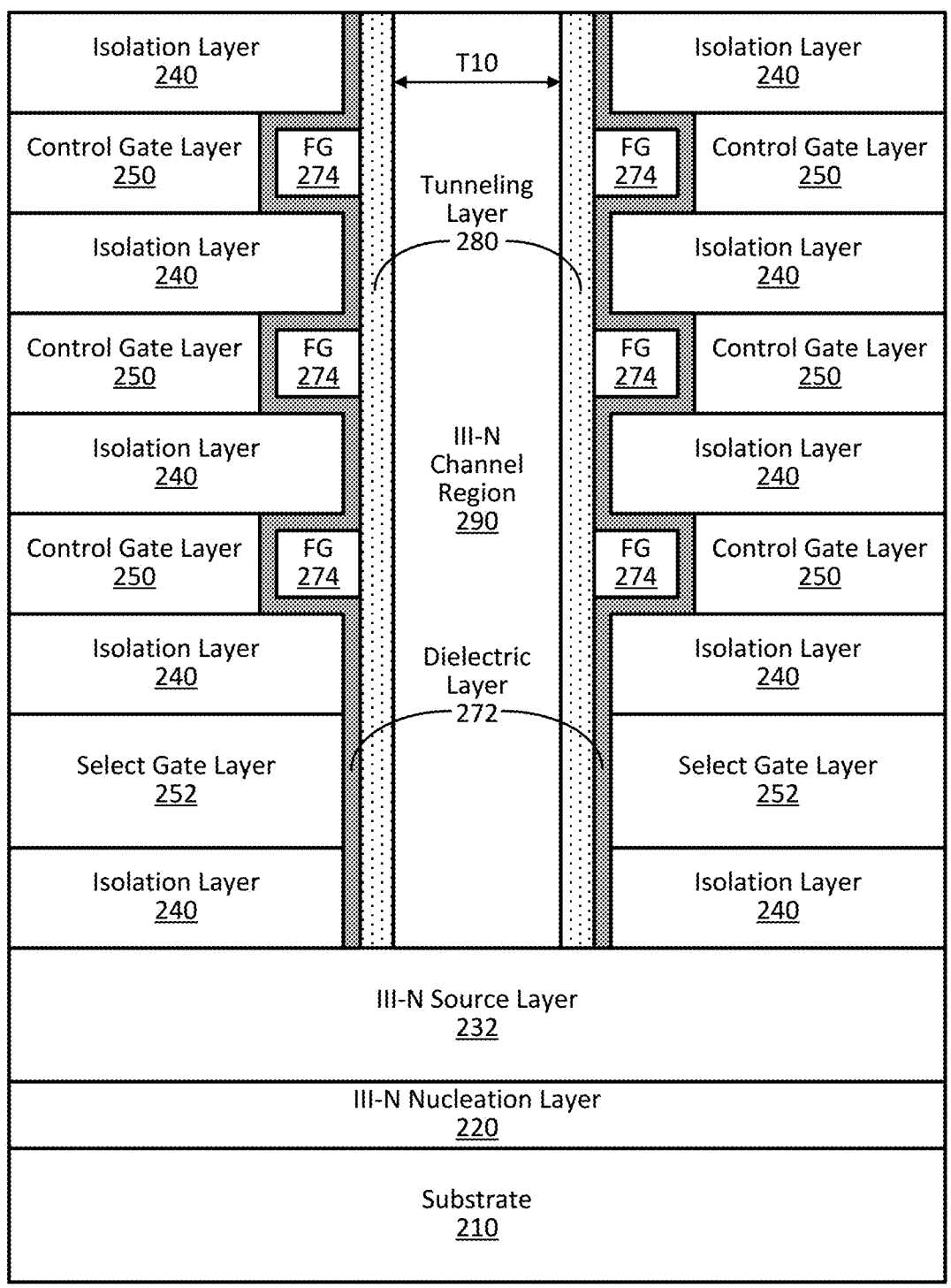

Method 100 of FIG. 1 continues with depositing 124 III-N channel material in the trench of the structure of FIG. 2F to form the example structure of FIG. 2G, in accordance with an embodiment. As shown in FIG. 2G, III-N channel region 290 has been formed in the trench 260 of the Figure of 2F, in this example embodiment. As can be understood based on this disclosure, in some embodiments, III-N channel region 290 allows for the flow of charge carriers from the source to the drain for a 3D NAND flash memory device. In some embodiments, II-N channel region 290 may be formed using any suitable techniques, such as depositing/growing the region 290 (e.g., on III-N source layer 232) using any of the aforementioned techniques, such as MOCVD, MBE, CVD, ALD, PVD, and/or any other suitable processes as will be apparent in light of this disclosure. In some embodiments, deposition/growth of III-N channel region 290 material may fill up the majority of trench 260 in the example structure of FIG. 2F. In this example embodiment, III-N channel region 290 material is grown between tunneling layer 280, which was on the sidewalls of trench 260, in the example structure of FIG. 2F. In some embodiments, III-N channel region 290 may include any suitable III-N material, such as GaN, InGaN, and/or InN for example. In some embodiments, III-N channel region 290 may be doped with impurities, such as being n-type doped (e.g., using Si and/or Ge), for example. In some such embodiments, the III-N channel region 290 may be lightly doped, with the dopant ranging between 1E16 and 2E18 atoms per cubic cm, for example. In some embodiments, the III-N channel region 290 may have a multi-layer structure including at least two III-N materials. In some embodiments, the III-N channel region 290 may include grading (e.g., increasing and/or decreasing) the content of one or more materials throughout the region, as described in more detail herein with reference to FIG. 5. In some embodiments, III-N channel region 290 may have any suitable thickness T10 (dimension in the X direction), such as a thickness of 10 to 100 nm (e.g., 20 to 40 nm), or any other suitable thickness as will be apparent in light of this disclosure. In some embodiments, III-N channel region 290 may have any suitable height (dimension in the Y direction), such as a height of 100 nm to 2 mm (e.g., 500 nm to 1 mm), or any other suitable height as will be apparent in light of this disclosure. As can be understood based on this disclosure, the height of III-N channel region 290 may depend upon the number of sets of alternating isolation layers 240 and control gate layers 250 formed in the stack for the 3D NAND flash memory device, for example. Numerous III-N channel configurations for 3D NAND will be apparent in light of the present disclosure.

Method 100 of FIG. 1 continues with completing 126 formation of one or more 3D NAND structures, such as one or more 3D NAND flash memory devices, in accordance with an embodiment. For example, additional processing may include forming drain 234 on the III-N channel region 290 in the structure of FIG. 2G to form the example structure of FIG. 2H, in accordance with an embodiment. In some embodiments, drain 234 may be formed by depositing an interlayer dielectric (ILD) layer 233 on the top of the structure of FIG. 2G, forming mask on portions other than where drain 234 is to be formed, etching the ILD 233 layer in the area where drain 234 is to be formed, and depositing drain 234 material to form the structure shown in FIG. 2H, for example. In some embodiments, drain 234 may include any suitable electrically conductive material, such as a metal or metal alloy, for example. In some embodiments, ILD layer 233 may include any suitable electrically insulating material, such as an oxide (e.g., silicon oxide), a nitride (e.g., silicon nitride), and/or a dielectric material, for example. In some embodiments, drain 234 may have any suitable width (the dimension in the X direction), such as a width of 20 to 300 nm (e.g., 50 to 200 nm), or any suitable width as will be apparent in light of this disclosure. In some embodiments, drain 234 may have any suitable height or thickness (the dimension in the Y direction, such as a height of 10 to 300 nm (e.g., 20 to 200 nm), or any suitable height as will be apparent in light of this disclosure. As can be understood based on this disclosure, any suitable additional processing may be performed to form one or more 3D NAND structures.

Figure 2H:
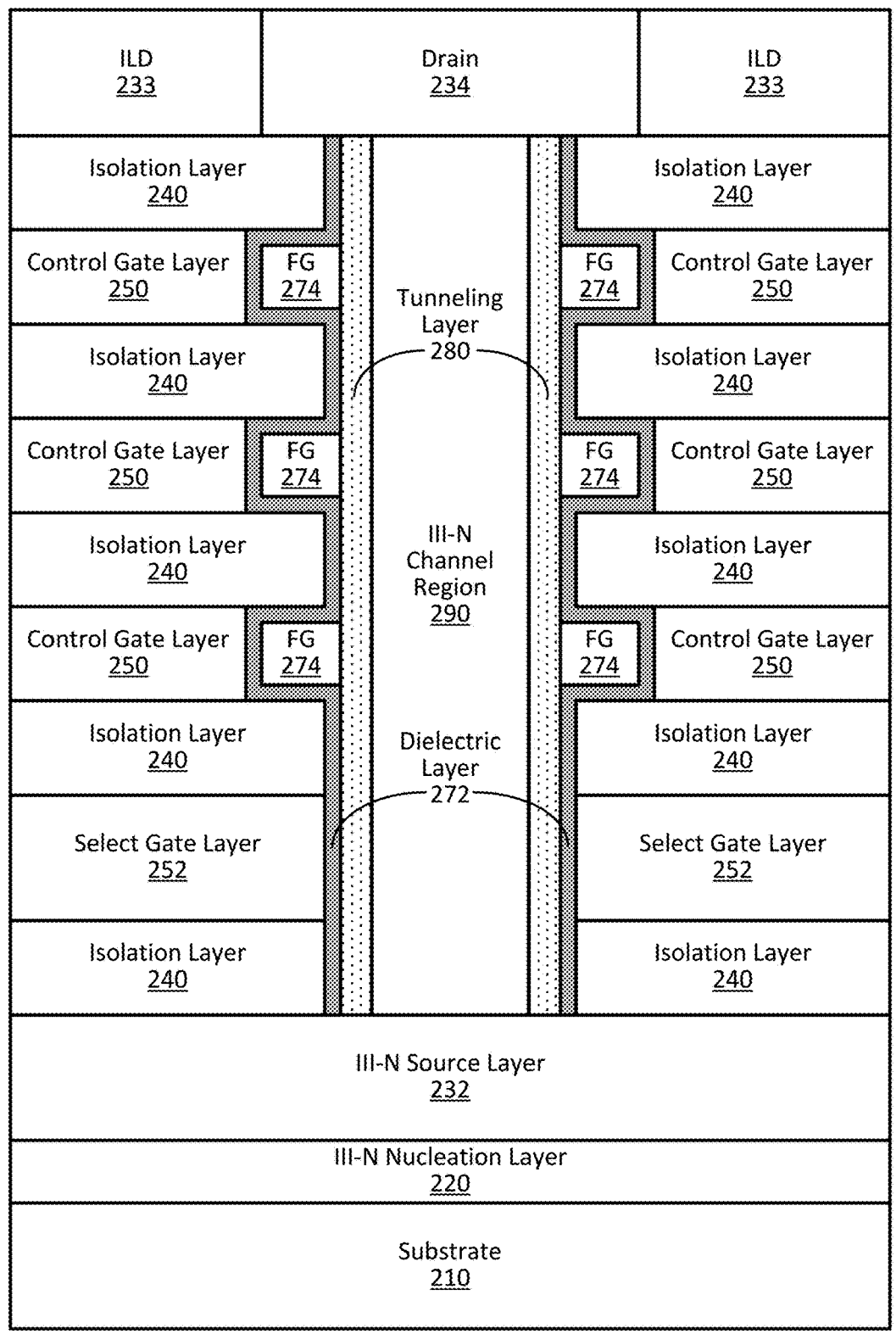

As shown in FIG. 2H, a 3D NAND structure including a III-N channel region 290 can be formed using the techniques described herein. In this example structure, the III-N source layer 232 is above substrate 210 and a stack of alternating isolation layers 240 and control gate layers 250 are above the III-N source layer 232. Further note, in this example structure, there are three control gate layers 250 included and thus three corresponding floating gates 274 are included between each control gate layer 250 and tunneling layer 280. In other words, the floating gates 274 are included between each control gate layer 250 and the III-N channel region 290, as shown. As previously described, the present disclosure is not intended to be limited to any particular number of alternating layers (e.g., isolation layers 240 and/or control gate layers 250) in the stack above the III-N source layer 232 and it is also not intended to be limited to any particular number of floating gates 274, unless otherwise stated. Continuing with the example structure of FIG. 2H, tunneling layer 280 is between the III-N channel region 290 and each floating gate 274, in this example embodiment. Further, dielectric layer 272 is between each control gate layer 250 and the corresponding floating gate 274, in this example embodiment. Further still, select gate layer 252 is above the III-N source layer 232 and is also between III-N source layer 232 and the stack of alternating isolation layers 240 and control gate layers 250, as shown. Numerous different relative positions of the various layers and features of the 3D NAND structure of FIG. 2H will be apparent in light of the present disclosure.

FIG. 3 illustrates the example structure of FIG. 2H, including two variations, in accordance with some embodiments of the present disclosure. The two variations include that there is no III-N nucleation layer present in the example structure of FIG. 3 and there is also no select gate layer. As previously described, the III-N nucleation layer 220 present in the structure of FIG. 2H is optional and need not be present in some embodiments. Therefore, as shown in FIG. 3, III-N source layer 232 is formed on substrate 210, in the example embodiment. Further, as was also previously described, the select gate layer 252 present in the structure of FIG. 2H is optional and need not be present in some embodiments. Therefore, as shown in FIG. 3, the stack above the III-N source layer 232 includes alternating isolation layers 240 and control gate layers 250, without a select gate layer being included in the stack.

Figure 4:
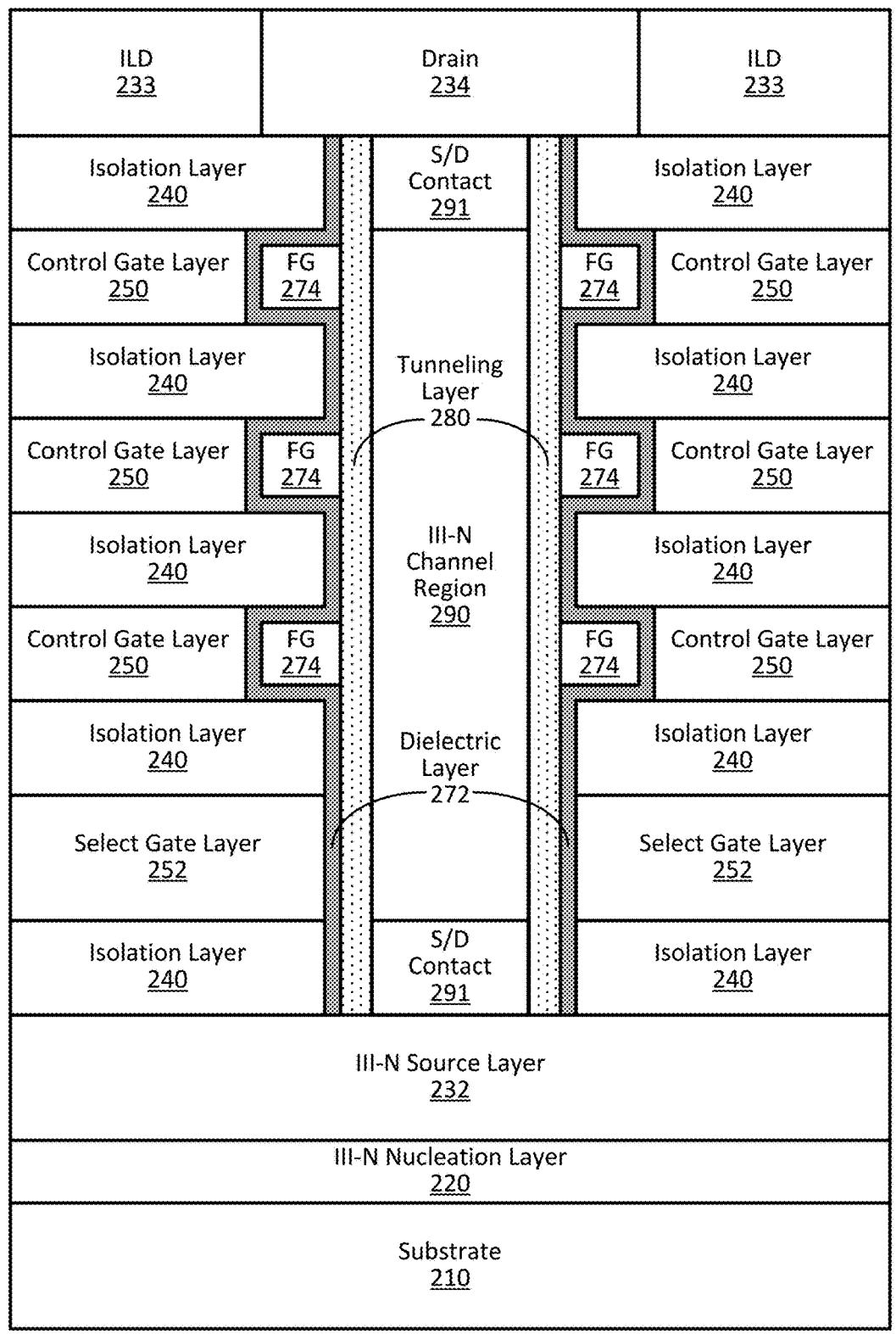
FIG. 4 illustrates the example structure of FIG. 2H, including source and drain (S/D) contacts, in accordance with some embodiments of the present disclosure.

FIG. 4 illustrates the example structure of FIG. 2H, including source and drain (S/D) contacts, in accordance with some embodiments of the present disclosure. In the example structure of FIG. 4, S/D contacts 291 may be included to improve the resistance drop at the source 232 and drain 234 portions of the transistor, thereby improving the 3D NAND performance. In some such embodiments including S/D contacts 291, the S/D contacts 291 may include III-N material and may be doped, such as with an n-type dopant (e.g., Si and/or Ge). Further, in some such embodiments, where the S/D contacts 291 include n-type dopant, it may be in high amounts, such as concentrations of greater than 2E19, 2E20, or 2E21 atoms per cubic cm, for example. Note that in some embodiments, only one of the S/D contacts 291 may be present, such that only a contact 291 for source 232 or only a contact 291 for drain 234 may be present in the 3D NAND structure.

Figure 5:
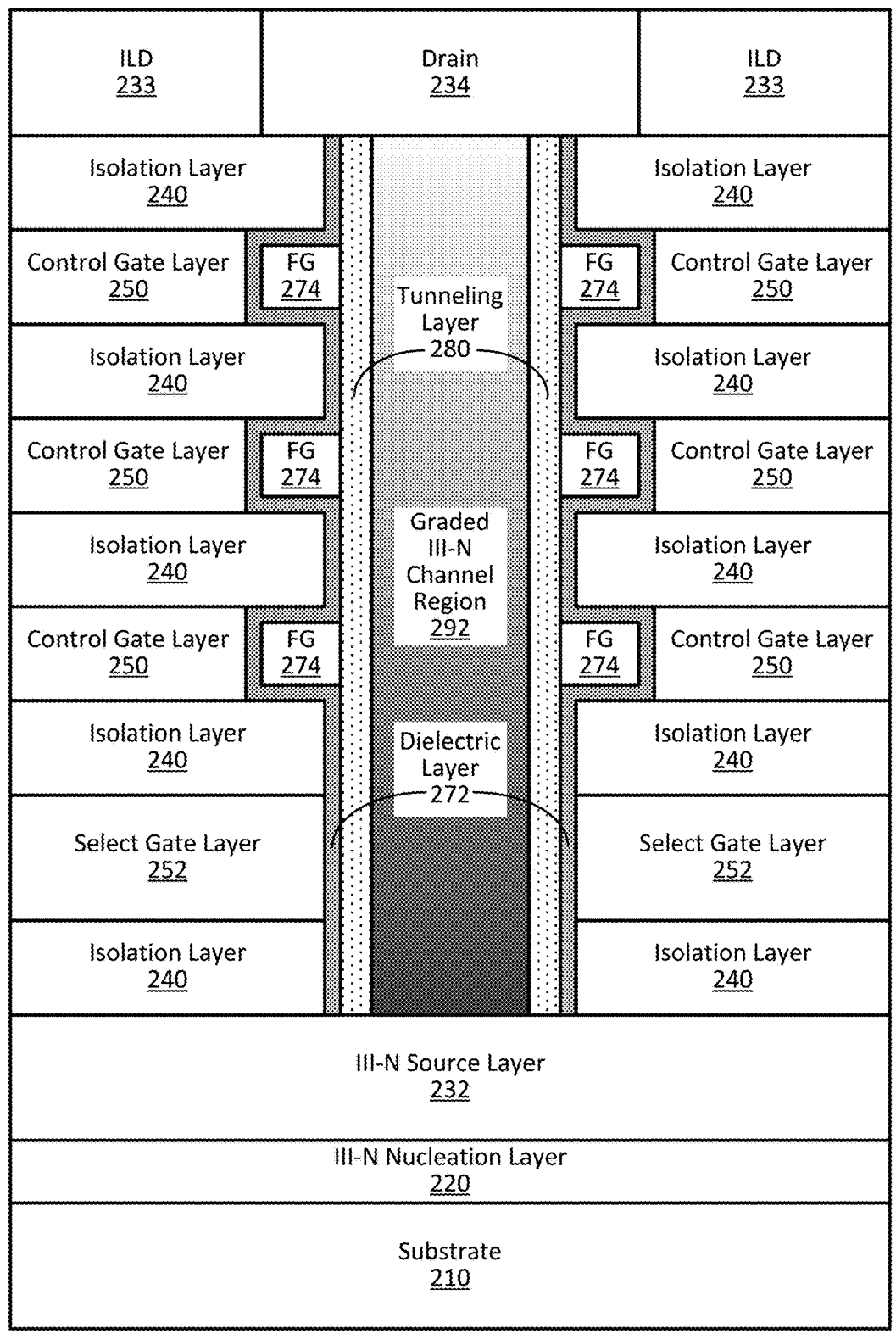
FIG. 5 illustrates the example structure of FIG. 2H, including a graded III-N channel region, in accordance with some embodiments of the present disclosure.

FIG. 5 illustrates the example structure of FIG. 2H, including a graded m-N channel region, in accordance with some embodiments of the present disclosure. In the example structure of FIG. 5, III-N channel region 292 may be graded to reduce resistance as an increasing number of alternating isolation layers 240 and control gate layers 250 are included in the stack of the 3D NAND structure, for example. In some embodiments, graded III-N channel region 292 may be formed using any suitable techniques, such as increasing and/or decreasing the content of material and/or dopant of the channel region 292 during deposition of the same. In some embodiments, the concentration of one or more materials may be increased and/or decreased when moving along the graded III-N channel region 292 (e.g., in a positive Y direction). In some embodiments, the concentration of one or more dopants may be increased and/or decreased when moving along the graded III-N channel region 292 (e.g., in a positive Y direction). For instance, in some embodiments, graded III-N channel region 292 may include InGaN material where the indium content is decreased from the bottom of the channel region (e.g., the portion nearest III-N source layer 232) to the top of the channel region (e.g., the portion nearest drain 234). In some such embodiments, the indium content in the InGaN channel region may start between 10 and 25 percent near the III-N source layer 232 and then decrease to an amount between 0 and 10 percent going up the channel region (going in the positive Y direction) and away from the III-N source layer 232 (and toward drain 234). In some embodiments, graded III-N channel region 292 may include n-type doping (e.g., Si and/or Ge) where the dopant content is decreased from the bottom of the channel region (e.g., the portion nearest III-N source layer 232) to the top of the channel region (e.g., the portion nearest drain 234). In some such embodiments, the doping concentration may start between 2E19 and 2E21 atoms per cubic cm near the III-N source layer 232 and then decrease to an amount between 0 and 2E19 atoms per cubic cm going up the channel region (going in the positive Y direction) and away from the III-N source layer 232 (and toward drain 234). As shown in FIG. 5, graded III-N channel region 292 is shaded from dark to light going up the region (going in the positive Y direction) to help illustrate decreasing amounts of indium (In) and/or n-type dopant, for example.

Figure 6:
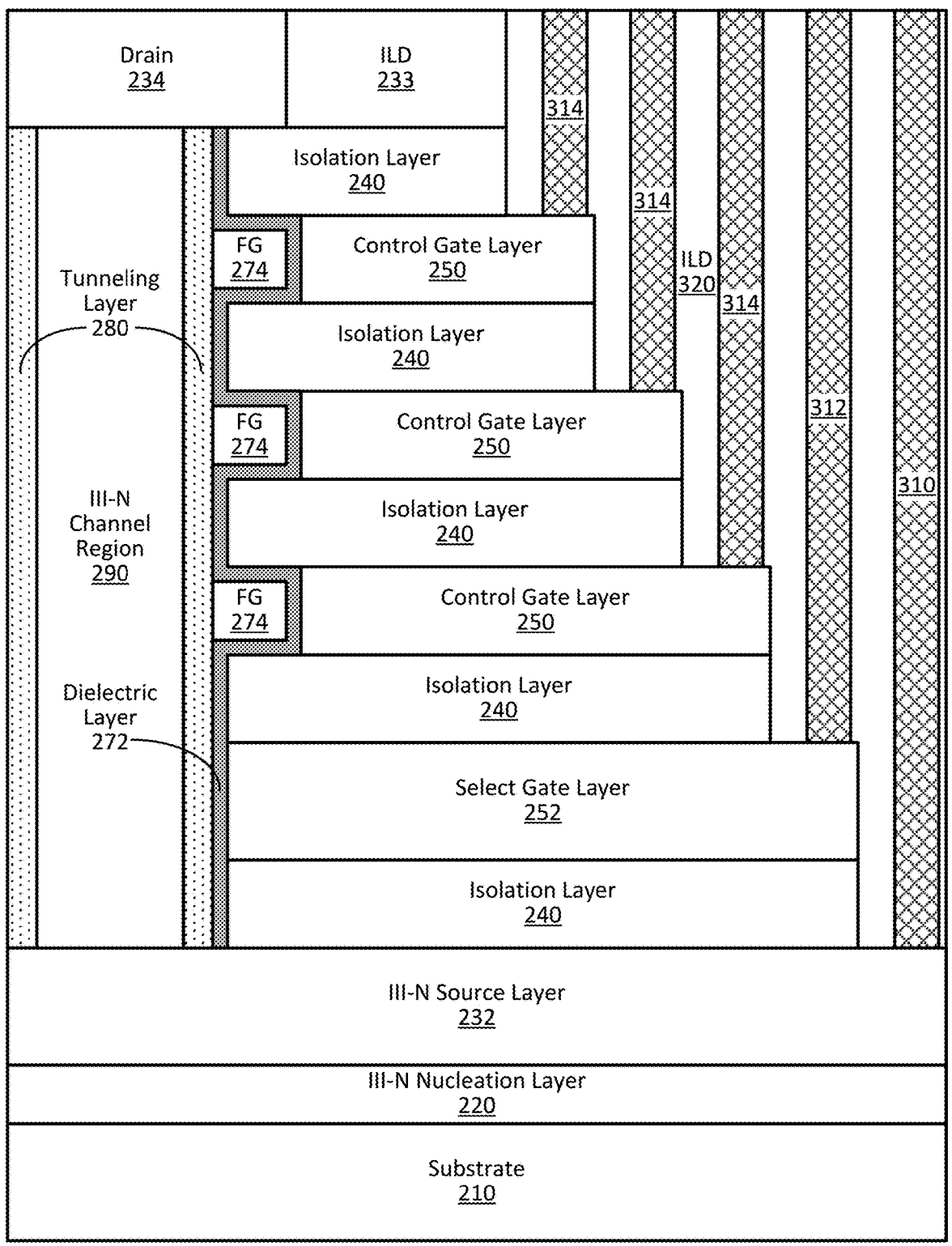
FIG. 6 illustrates the example structure of FIG. 2H, showing how contact can be made to various layers in the structure, in accordance with some embodiments of the present disclosure.

FIG. 6 illustrates the example structure of FIG. 2H, showing how contact can be made to various layers in the structure, in accordance with some embodiments of the present disclosure. As shown, the example structure of FIG. 2H is offset in FIG. 6 to illustrate the step-wise or staircase structure that can be used, in some embodiments, to make contact to III-N source layer 232, select gate layer 252, and control gate layers 250 of the 3D NAND structure. In such an example embodiment, the step-wise or staircase structure may be formed using any suitable techniques, as will be apparent in light of this disclosure. As shown, contact 310 is for III-N source layer 232, contact 312 is for select gate layer 252 and contacts 314 are for control gate layers 250, in this example embodiment. In addition, the contacts were formed in ILD 320 as shown, which may have been performed in a layer-by-layer basis or it may have been performed by depositing the entirety of the ILD 320 area and then forming vias in the ILD material for deposition of the contacts, for example. In some embodiments, contacts 310, 312, and 314 may include any suitable electrically conductive material, such as a metal or metal alloy (e.g., copper or tungsten), for example. The structure of FIG. 6 is provided as one example technique for making contact to various layers in the 3D NAND structure and is not intended to limit the present disclosure. Numerous variations and configurations will be apparent in light of the present disclosure.

Example System

Figure 7:
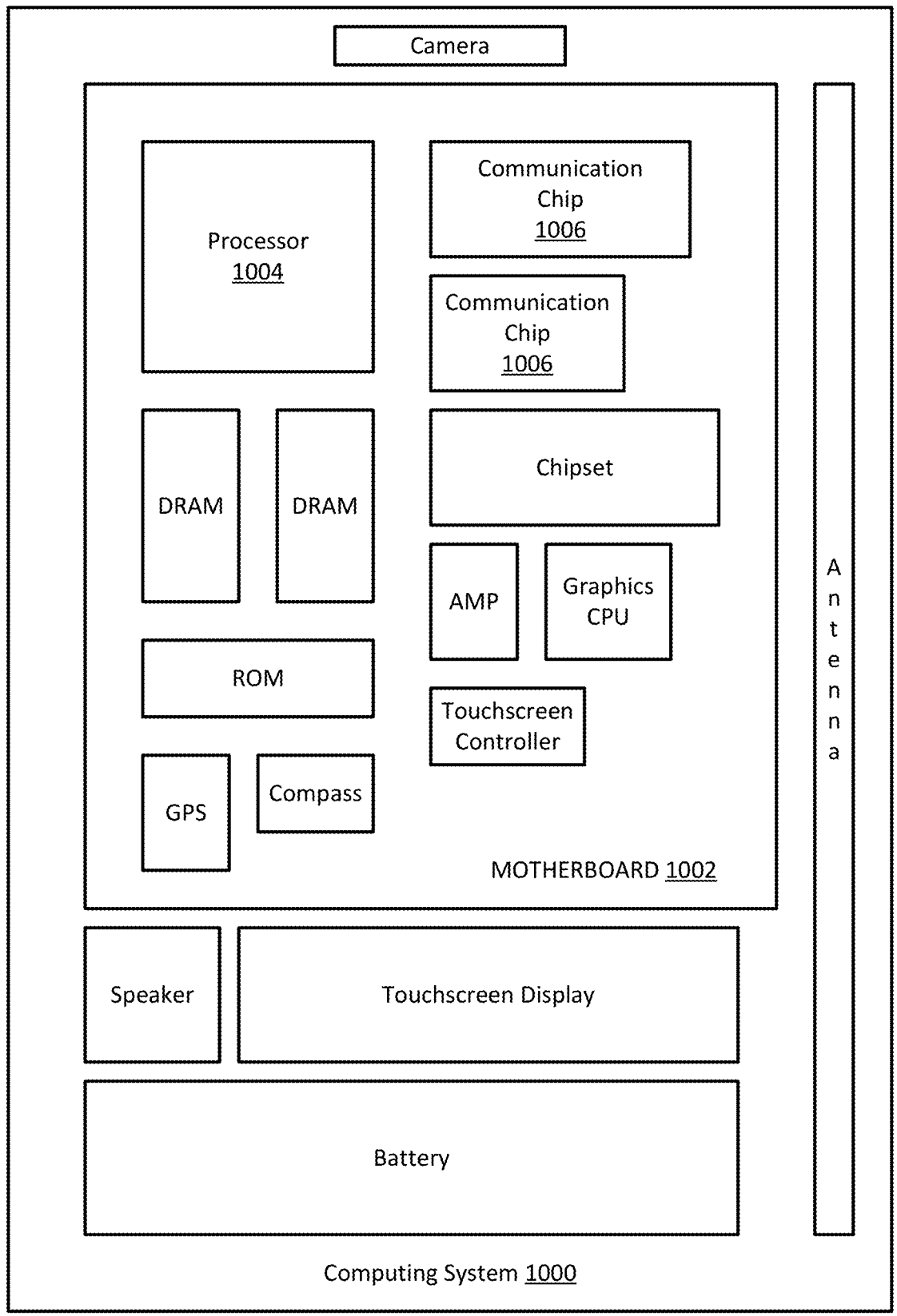
FIG. 7 illustrates an example computing system implemented with the integrated circuit structures and/or techniques disclosed herein, in accordance with some embodiments of the present disclosure.

FIG. 7 illustrates an example computing system 1000 implemented with the integrated circuit structures and/or techniques disclosed herein, in accordance with some embodiments of the present disclosure. As can be seen, the computing system 1000 houses a motherboard 1002.

The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM, 3D NAND flash memory), a graphics processor, a digital signal processor, a crypto processor, a chipset, an antenna, a display, a touchscreen display, a touchscreen controller, a battery, an audio codec, a video codec, a power amplifier, a global positioning system (GPS)

device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit (IC) including: a substrate; a source layer above the substrate, wherein the source layer includes group III-nitride (III-N) material; a stack of alternating isolation layers and control gate layers above the source layer; a channel region disposed adjacent to the stack of alternating layers, wherein the channel region includes group III-N material; a floating gate between at least one control gate layer and the channel region; and a tunneling layer between the channel region and the floating gate. Note that in some cases, the channel region may be substantially vertical, for example.

Example 2 includes the subject matter of Example 1, wherein the substrate includes silicon (Si).

Example 3 includes the subject matter of any of Examples 1-2, further including a nucleation layer between the substrate and the source, wherein the nucleation layer includes aluminum nitride (AlN).

Example 4 includes the subject matter of any of Examples 1-3, wherein the source layer includes n-type doped indium gallium nitride (InGaN) having a dopant concentration of greater than 2E19 atoms per cubic cm.

Example 5 includes the subject matter of any of Examples 1-4, wherein each isolation layer includes an oxide material.

Example 6 includes the subject matter of any of Examples 1-5, wherein each isolation layer has a thickness in the stack in range of 20 to 200 nm.

Example 7 includes the subject matter of any of Examples 1-6, wherein each control gate layer includes at least one of tantalum nitride (TaN), titanium nitride (TiN), polycrystalline silicon (poly-Si), and tungsten (W).

Example 8 includes the subject matter of any of Examples 1-7, wherein each control gate layer has a thickness in the stack range of 20 to 100 nm.

Example 9 includes the subject matter of any of Examples 1-8, further including a dielectric layer between each control gate layer and the channel region.

Example 10 includes the subject matter of any of Examples 1-9, wherein the channel region includes at least one of gallium nitride (GaN), indium gallium nitride (InGaN), and indium nitride (InN).

Example 11 includes the subject matter of any of Examples 1-10, wherein the channel region is at least partially doped with an n-type dopant.

Example 12 includes the subject matter of any of Examples 1-11, wherein the channel region includes grading of at least one of n-type dopant content and indium content, such that the at least one of n-type dopant content and indium content is greatest in the channel region near the source layer and decreases with increasing distance from the source layer.

Example 13 includes the subject matter of any of Examples 1-12, further including a source contact layer between the channel region and the source layer, the source contact layer including indium gallium nitride (InGaN) and having an n-type dopant concentration of greater than 2E19 atoms per cubic cm.

Example 14 includes the subject matter of any of Examples 1-13, further including a select gate layer above the source layer, wherein the select gate layer has a thickness in the stack greater than the control gate layers.

Example 15 includes the subject matter of any of Examples 1-14, wherein the floating gate includes at least one of tungsten (W), titanium nitride (TiN), tantalum nitride (TaN), silicon nitride (SiN), silicon oxynitride (SiON), aluminum gallium nitride (AlGaN), and aluminum nitride (AlN).

Example 16 includes the subject matter of any of Examples 1-15, wherein the tunneling layer includes at least one of an oxide material and silicon nitride (SiN).

Example 17 includes the subject matter of any of Examples 1-16, wherein the stack includes at least 100 isolation layers and at least 100 control gate layers.

Example 18 is a three-dimensional (3D) NAND flash memory device including the subject matter of any of Examples 1-17.

Example 19 is a computing system including the subject matter of any of Examples 1-17.

Example 20 is a three-dimensional (3D) NAND flash memory device including: a substrate; a nucleation layer on the substrate, wherein the nucleation layer includes group III-nitride (III-N) material; a source layer above the substrate, wherein the source layer includes group III-N material; a stack of alternating isolation layers and control gate layers above the source layer; a select gate layer between the source layer and the stack of alternating layers; a channel region in electrical contact with the source layer and between the stack of alternating layers, wherein the channel region includes group III-N material and n-type dopants having a concentration of at least 1E16 atoms per cubic cm; a floating gate between each control gate layer and the channel region; a dielectric layer between each control gate layer and the corresponding floating gate; a tunneling layer between the channel region and each floating gate; and a drain above the channel region.

Example 21 includes the subject matter of Example 20, wherein the substrate includes silicon (Si).

Example 22 includes the subject matter of any of Examples 20-21, wherein the source layer includes n-type doped indium gallium nitride (InGaN) having a dopant concentration of greater than 2E19 atoms per cubic cm.

Example 23 includes the subject matter of any of Examples 20-22, wherein each isolation layer includes an oxide material.

Example 24 includes the subject matter of any of Examples 20-23, wherein each isolation layer has a thickness in the stack in range of 20 to 200 nm.

Example 25 includes the subject matter of any of Examples 20-24, wherein each control gate layer includes at least one of tantalum nitride (TaN), titanium nitride (TiN), polycrystalline silicon (poly-Si), and tungsten (W).

Example 26 includes the subject matter of any of Examples 20-25, wherein each control gate layer has a thickness in the stack range of 20 to 100 nm.

Example 27 includes the subject matter of any of Examples 20-26, wherein the channel region includes at least one of gallium nitride (GaN), indium gallium nitride (InGaN), and indium nitride (InN).

Example 28 includes the subject matter of any of Examples 20-27, wherein the channel region includes grading of at least one of n-type dopant content and indium content, such that the at least one of n-type dopant content and indium content is greatest in the channel region near the source layer and decreases with increasing distance from the source layer.

Example 29 includes the subject matter of any of Examples 20-28, further including a source contact layer between the channel region and the source layer, the source contact layer including indium gallium nitride (InGaN) and having an n-type dopant concentration of greater than 2E19 atoms per cubic cm.

Example 30 includes the subject matter of any of Examples 20-29, wherein the select gate layer has a thickness in the stack greater than the control gate layers.

Example 31 includes the subject matter of any of Examples 20-30, wherein each floating gate includes at least one of tungsten (W), titanium nitride (TiN), tantalum nitride (TaN), silicon nitride (SiN), silicon oxynitride (SiON), aluminum gallium nitride (AlGaN), and aluminum nitride (AlN).

Example 32 includes the subject matter of any of Examples 20-31, wherein the tunneling layer includes at least one of an oxide material and silicon nitride (SiN).

Example 33 includes the subject matter of any of Examples 20-32, wherein the stack includes at least 100 floating gates.

Example 34 is a computing system including the subject matter of any of Examples 20-33.

Example 35 is a method of forming an integrated circuit (IC), the method including: providing a substrate; forming a source layer above the substrate, wherein the source layer includes group III-nitride (III-N) material; form a stack of alternating isolation layers and control gate layers above the source layer; form a trench in the stack of alternating layers; selectively etch, within the trench in the stack of alternating layers, a portion of the control gate layers; deposit floating gate material in the trench and perform an etch process; deposit tunneling layer material in the trench and perform an etch process; and deposit channel region material in the trench, wherein the channel region includes group III-N material.

Example 36 includes the subject matter of Example 35, further including forming a dielectric layer in the trench prior to depositing the floating gate material.

Example 37 includes the subject matter of any of Examples 35-36, further including forming a select gate layer above the source layer prior to forming the stack of alternating layers.

Example 38 includes the subject matter of any of Examples 35-37, further including forming a nucleation layer on the substrate prior to forming the source layer, wherein the nucleation layer includes III-N material.

Example 39 includes the subject matter of any of Examples 35-38, further including forming a drain above the channel region.

Example 40 includes the subject matter of any of Examples 35-39, further including forming contacts to each of the control gate layers and the source layer.

Example 41 includes the subject matter of any of Examples 35-40, wherein selectively etching a portion of the control gate layers includes performing a wet etch process using an etchant that removes material of the control gate layer at a rate of at least three times as fast as the etchant removes material of the isolation layers.

Example 42 includes the subject matter of any of Examples 36-41, further including forming a three-dimensional (3D) NAND flash memory device.

The foregoing description of example embodiments has been presented for the purposes of illustration and description. It is not intended to be exhaustive or to limit this disclosure to the precise forms disclosed. Many modifications and variations are possible in light of this disclosure.

It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) comprising:
a substrate;
a source layer above the substrate, wherein the source layer includes group III-nitride (III-N) material;
a stack of alternating isolation layers and control gate layers above the source layer;
a semiconductor region adjacent to the stack of alternating layers, wherein the semiconductor region includes group III-N material;
a floating gate between at least one control gate layer and the semiconductor region; and
a tunneling layer between the semiconductor region and the floating gate.

2. The IC of claim 1, wherein the substrate includes silicon (Si).

3. The IC of claim 1, further comprising a nucleation layer between the substrate and the source layer, wherein the nucleation layer includes aluminum nitride (AlN).

4. The IC of claim 1, wherein the source layer includes n-type doped indium gallium nitride (InGaN) having a dopant concentration of greater than 2E19 atoms per cubic cm.

5. The IC of claim 1, wherein each of one or more of the isolation layers includes an oxide material.

6. The IC of claim 1, wherein each of one or more of the isolation layers has a thickness in the stack in range of 20 to 200 nm.

7. The IC of claim 1, wherein each of one or more of the control gate layers includes at least one of tantalum nitride (TaN), titanium nitride (TiN), polycrystalline silicon (poly-Si), and tungsten (W).

8. The IC of claim 1, wherein each of one or more of the control gate layers has a thickness in the stack range of 20 to 100 nm.

9. The IC of claim 1, further comprising a dielectric layer between each control gate layer and the semiconductor region.

10. The IC of claim 1, wherein the semiconductor region includes at least one of gallium nitride (GaN), indium gallium nitride (InGaN), and indium nitride (InN).

11. The IC of claim 1, wherein the semiconductor region is at least partially doped with an n-type dopant.

12. The IC of claim 1, wherein the semiconductor region includes grading of one or both of n-type dopant content and indium content, such that the one or both of n-type dopant content and indium content is greatest in the semiconductor region near the source layer and decreases with increasing distance from the source layer.

13. The IC of claim 1, further comprising a source contact layer between the semiconductor region and the source layer, the source contact layer including indium gallium nitride (InGaN) and having an n-type dopant concentration of greater than 2E19 atoms per cubic cm.

14. The IC of claim 1, further comprising a select gate layer above the source layer, wherein the select gate layer has a thickness in the stack greater than the control gate layers.

15. The IC of claim 1, wherein the floating gate includes at least one of tungsten (W), titanium nitride (TiN), tantalum nitride (TaN), silicon nitride (SiN), silicon oxynitride (SiON), aluminum gallium nitride (AlGaN), and aluminum nitride (AlN).

16. The IC of claim 1, wherein the tunneling layer includes at least one of an oxide material and silicon nitride (SiN).

17. The IC of claim 1, wherein the stack includes at least 100 isolation layers and at least 100 control gate layers.

18. A three-dimensional (3D) NAND flash memory device including the IC of claim 1.

19. A three-dimensional (3D) NAND flash memory device comprising:
a substrate;
a nucleation layer on the substrate, wherein the nucleation layer includes group III-nitride (III-N) material;
a source layer above the substrate, wherein the source layer includes group III-N material;
a stack of alternating isolation layers and control gate layers above the source layer;
a select gate layer between the source layer and the stack of alternating layers;
a channel region in electrical contact with the source layer and between the stack of alternating layers, wherein the channel region includes group III-N material and n-type dopants having a concentration of at least 1E16 atoms per cubic cm;
a floating gate between each of one or more control gate layers and the channel region;
a dielectric layer between each of one or more control gate layers and the corresponding floating gate;
a tunneling layer between the channel region and each of one or more floating gates; and
a drain above the channel region.

20. The 3D NAND device of claim 19, wherein the channel region includes at least one of gallium nitride (GaN), indium gallium nitride (InGaN), and indium nitride (InN).

* * * * *